United States Patent
Hikosaka et al.

(10) Patent No.: US 8,680,537 B2
(45) Date of Patent: Mar. 25, 2014

(54) NITRIDE SEMICONDUCTOR ELEMENT AND NITRIDE SEMICONDUCTOR WAFER

(75) Inventors: Toshiki Hikosaka, Kanagawa-ken (JP); Yoshiyuki Harada, Tokyo (JP); Hisashi Yoshida, Kanagawa-ken (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/602,868

(22) Filed: Sep. 4, 2012

(65) Prior Publication Data

US 2013/0234151 A1    Sep. 12, 2013

(30) Foreign Application Priority Data

Mar. 8, 2012 (JP) ................. 2012-052342

(51) Int. Cl.
*H01L 33/02*    (2010.01)

(52) U.S. Cl.
USPC ............... 257/76; 257/E33.035; 257/E33.028

(58) Field of Classification Search
CPC ..................... H01L 21/02458; H01L 21/0254; H01L 33/007
USPC ........................ 257/13, 76, E33.025, E33.028
See application file for complete search history.

(56) References Cited

U.S. PATENT DOCUMENTS

| | | |
|---|---|---|
| 2007/0197004 A1 | 8/2007 | Dadgar et al. |
| 2013/0026488 A1 | 1/2013 | Miyoshi et al. |

FOREIGN PATENT DOCUMENTS

| | | |
|---|---|---|
| JP | 2001-308464 | 11/2001 |
| JP | 2002-16009 | 1/2002 |
| JP | 2002-299253 | 10/2002 |
| JP | 2004-179452 | 6/2004 |
| JP | 2006-80497 | 3/2006 |
| JP | 2007-290895 | 11/2007 |
| JP | 2009-527913 | 7/2009 |
| JP | 2010-73760 | 4/2010 |
| JP | 2010-228967 | 10/2010 |
| WO | WO 2008/112096 A2 | 9/2008 |
| WO | WO 2011/136051 A1 | 3/2011 |

OTHER PUBLICATIONS

U.S. Appl. No. 13/868,275, filed Apr. 23, 2013, Harada, et al.
U.S. Appl. No. 13/407,169, filed Feb. 28, 2012, Tomonari Shioda, et al.
U.S. Appl. No. 13/222,561, filed Aug. 31, 2011, Tomonari Shioda, et al.
Office Action issued Jul. 13, 2012 in Japanese Application No. 2012-052342 (With English Translation).
Office Action issued Dec. 4, 2012 in Japanese Patent Application No. 2012-052342 with English language translation.

*Primary Examiner* — Nikolay Yushin
(74) *Attorney, Agent, or Firm* — Oblon, Spivak, McClelland, Maier & Neustadt, L.L.P.

(57) ABSTRACT

According to one embodiment, a nitride semiconductor element includes a foundation layer, a functional layer and a stacked body. The stacked body is provided between the foundation layer and the functional layer. The stacked body includes a first stacked intermediate layer including a first GaN intermediate layer, a first high Al composition layer of $Al_{x1}Ga_{1-x1}N$ ($0<x1\le 1$) and a first low Al composition layer. A compressive strain is applied to the first low Al composition layer. Unstrained GaN has a first lattice spacing. The $Al_{x1}Ga_{1-x1}N$ ($0<x1\le 1$) when unstrained has a second lattice spacing. The first high Al composition layer has a third lattice spacing. An Al composition ratio of the first low Al composition layer is not more than a ratio of a difference between the first and third lattice spacings to a difference between the first and second lattice spacings.

20 Claims, 8 Drawing Sheets

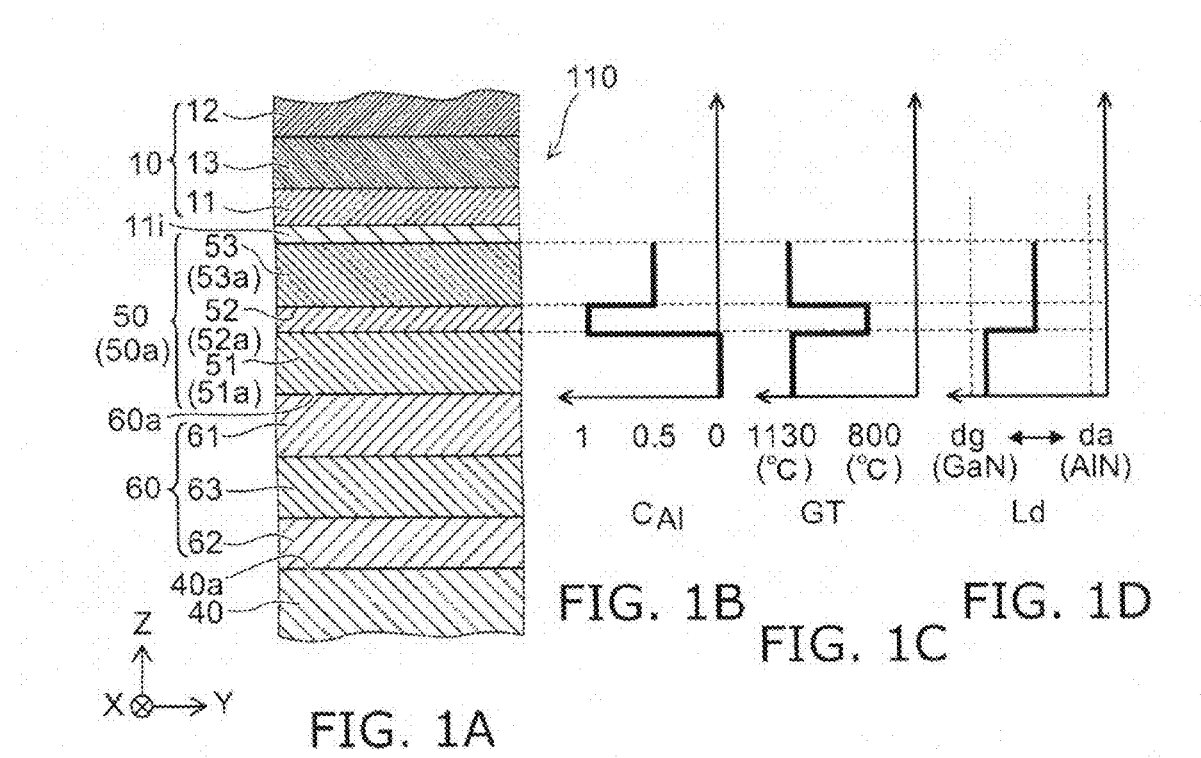

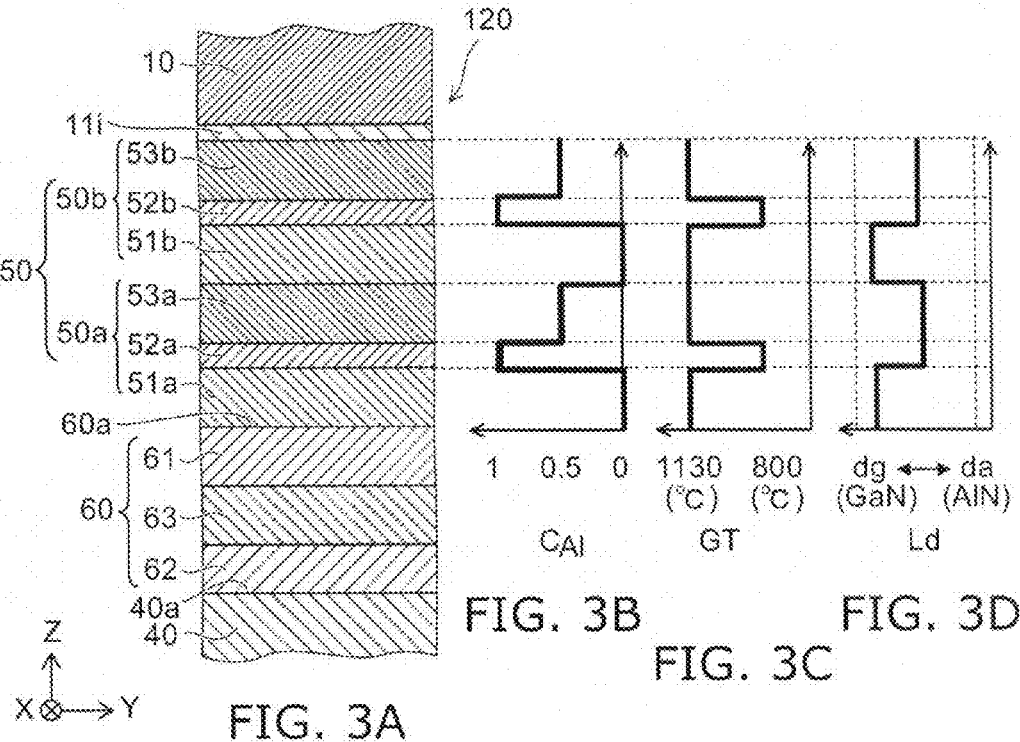
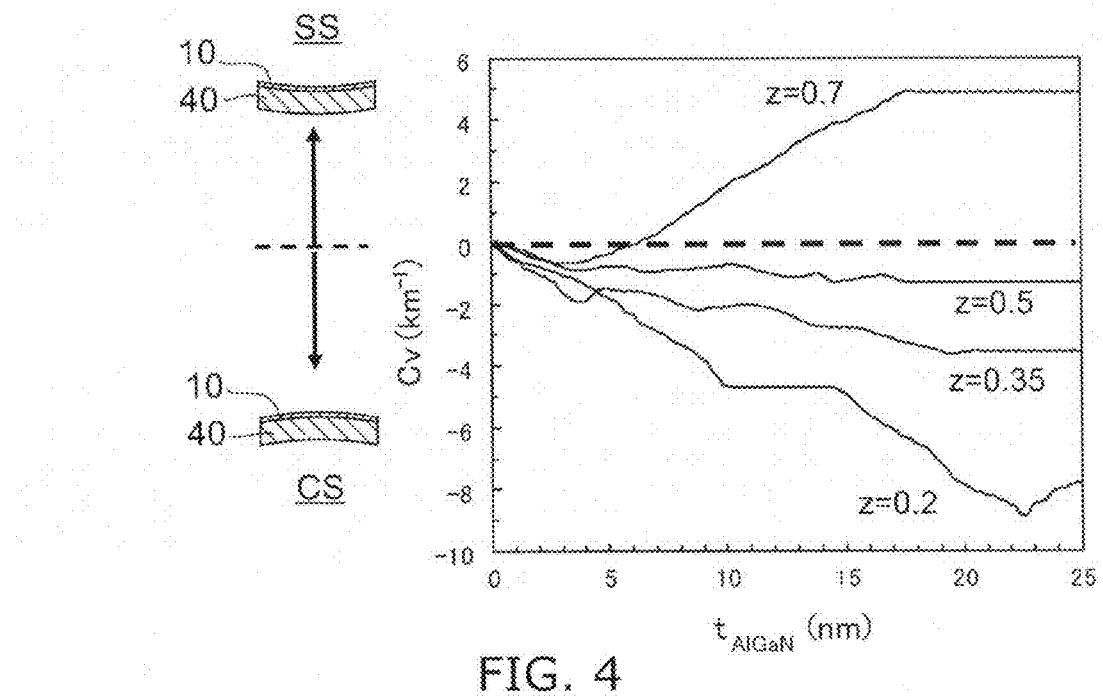
FIG. 4 z=0.2    1 mm z=0.35    1 mm z=0.5    1 mm z=0.7    1 mm

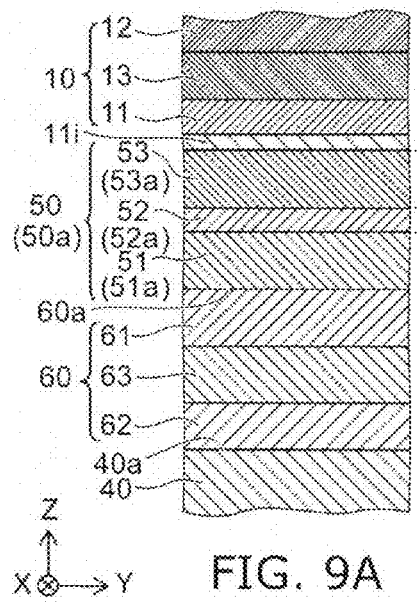
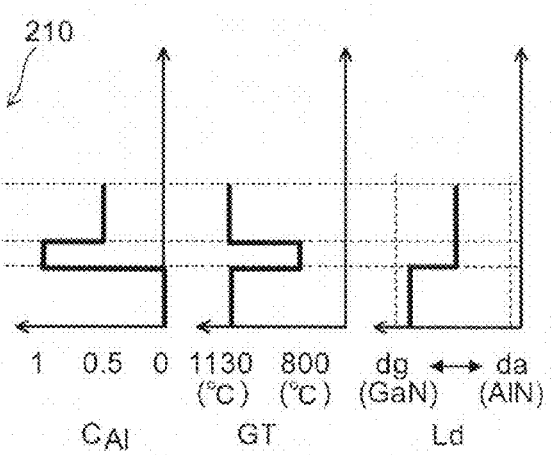
FIG. 9A  FIG. 9B  FIG. 9C  FIG. 9D
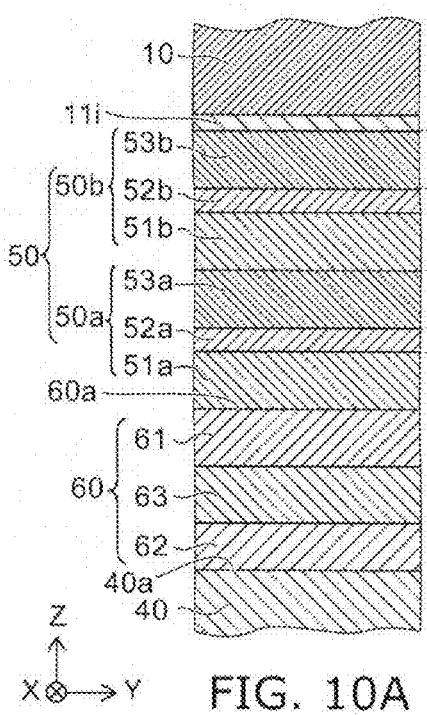
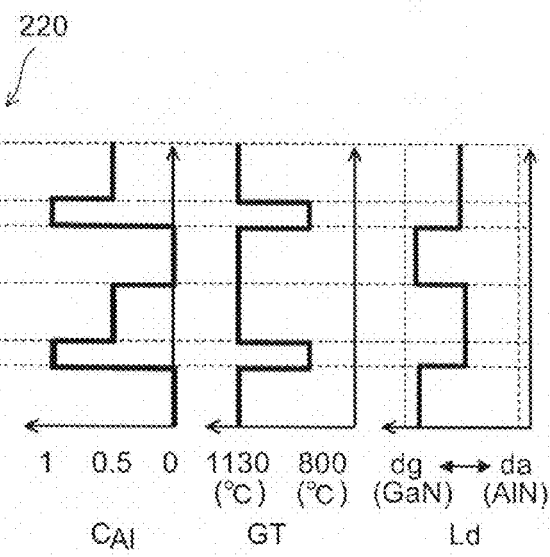
FIG. 10A  FIG. 10B  FIG. 10C  FIG. 10D

NITRIDE SEMICONDUCTOR ELEMENT AND NITRIDE SEMICONDUCTOR WAFER

CROSS-REFERENCE TO RELATED APPLICATIONS

This application is based upon and claims the benefit of priority from the prior Japanese Patent Application No. 2012-052342, filed on Mar. 8, 2012; the entire contents of which are incorporated herein by reference.

FIELD

Embodiments described herein relate generally to a nitride semiconductor element and a nitride semiconductor wafer.

BACKGROUND

Light emitting diodes (LEDs), which are examples of semiconductor light emitting elements that use nitride semiconductors, are used in, for example, display apparatuses, illumination, etc. Electronic devices that use nitride semiconductors are utilized in high-speed electronic devices and power devices.

In the case where such a nitride semiconductor element is formed on a silicon substrate that has excellent suitability for mass production, defects and cracks occur easily due to differences in lattice constants and coefficients of thermal expansion. In particular, technology to construct a high-quality crystal on a substrate of silicon and the like with few cracks is desirable.

BRIEF DESCRIPTION OF THE DRAWINGS

FIG. 1A to FIG. 1D are schematic views showing the configuration of a nitride semiconductor element according to the first embodiment;

FIG. 3A to FIG. 3D are schematic views showing the configuration of another nitride semiconductor element according to the first embodiment;

FIG. 4 is a graph showing the characteristics of the nitride semiconductor elements;

FIG. 9A to FIG. 9D are schematic views showing the configuration of the nitride semiconductor wafer according to the second embodiment;

FIG. 10A to FIG. 10D are schematic views showing the configuration of another nitride semiconductor wafer according to the second embodiment.

DETAILED DESCRIPTION

Figure 2A:
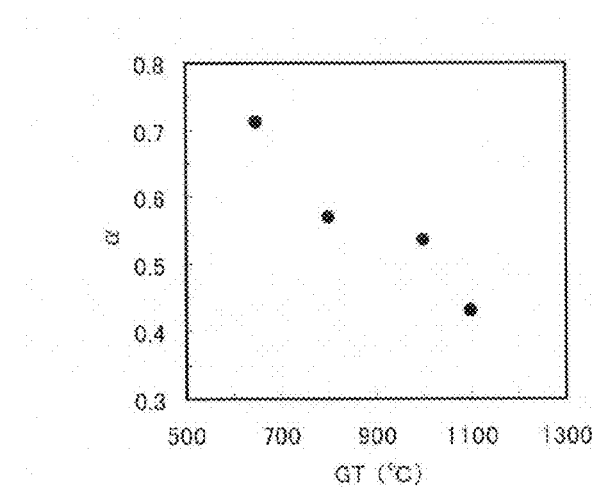
FIG. 2A to FIG. 2D are graphs showing characteristics of the nitride semiconductor element.

According to one embodiment, a nitride semiconductor element includes a foundation layer, a functional layer and a stacked body. The foundation layer includes an AlN buffer layer. The foundation layer has a major surface. The functional layer includes a nitride semiconductor. The stacked body is provided between the major surface and the functional layer. The stacked body includes a first stacked intermediate layer. The first stacked intermediate layer includes a first GaN intermediate layer, a first high Al composition layer of $Al_{x1}Ga_{1-x1}N$ ($0<x1\le1$) and a first low Al composition layer of $Al_{y1}Ga_{1-y1}N$ ($0<y1<1$ and $y1<x1$). The first GaN intermediate layer is provided on the foundation layer. The first high Al composition layer is provided on the first GaN intermediate layer. The first low Al composition layer is provided on the first high Al composition layer. A compressive strain is applied to the first low Al composition layer. Unstrained GaN has a first lattice spacing along a first axis parallel to the major surface. The $Al_{x1}Ga_{1-x1}N$ ($0<x1\le1$) when unstrained has a second lattice spacing along the first axis. The first high Al composition layer has a third lattice spacing along the first axis. An Al composition ratio of the first low Al composition layer is not more than a ratio of an absolute value of a difference between the first lattice spacing and the third lattice spacing to an absolute value of a difference between the first lattice spacing and the second lattice spacing.

According to another embodiment, a nitride semiconductor wafer includes a substrate, a foundation layer and a stacked body. The substrate has a major surface. The foundation layer is provided on the major surface and includes an AlN buffer layer. The stacked body is provided on the foundation layer. The stacked body includes a first stacked intermediate layer. The first stacked intermediate layer includes a first GaN intermediate layer, a first high Al composition layer of $Al_{x1}Ga_{1-x1}N$ ($0<x1\le1$) and a first low Al composition layer of $Al_{y1}Ga_{1-y1}N$ ($0<y1<1$ and $y1<x1$). The first GaN intermediate layer is provided on the foundation layer. The first high Al composition layer is provided on the first GaN intermediate layer. The first low Al composition layer is provided on the first high Al composition layer. A compressive strain is applied to the first low Al composition layer. Unstrained GaN has a first lattice spacing along a first axis parallel to the major surface. The $Al_{x1}Ga_{1-x1}N$ ($0<x1\le1$) when unstrained has a second lattice spacing along the first axis. The first high Al composition layer has a third lattice spacing along the first axis. An Al composition ratio of the first low Al composition layer is not more than a ratio of an absolute value of a difference between the first lattice spacing and the third lattice spacing to an absolute value of a difference between the first lattice spacing and the second lattice spacing.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

The embodiment relates to a nitride semiconductor element. The nitride semiconductor element according to the embodiment includes a semiconductor device such as a semiconductor light emitting element, a semiconductor light receiving element, an electronic device, etc. For example, the semiconductor light emitting element includes a light emitting diode (LED), a laser diode (LD), etc. The semiconductor light receiving element includes a photodiode (PD), etc. For example, the electronic device includes a high electron mobility transistor (HEMT), a heterojunction bipolar transistor (HBT), a field effect transistor (FET), a Schottky barrier diode (SBD), etc.

FIG. 1A to FIG. 1D are schematic views illustrating the configuration of a nitride semiconductor element according to the first embodiment.

FIG. 1A is a schematic cross-sectional view illustrating the configuration of the nitride semiconductor element 110 according to the embodiment. FIG. 1B is a graph illustrating the Al composition ratio ($C_{Al}$) of a stacked body. FIG. 1C is a graph illustrating a growth temperature GT (a formation temperature) of the stacked body. FIG. 1D is a graph illustrating lattice spacing Ld along an a-axis of the stacked body.

As illustrated in FIG. 1A, the nitride semiconductor element 110 according to the embodiment includes a foundation layer 60, a stacked body 50, and a functional layer 10. The foundation layer 60 has a major surface 60a. The stacked body 50 is provided between the major surface 60a of the foundation layer 60 and the functional layer 10. The stacked body 50 includes a first stacked intermediate layer 50a.

Herein, an axis perpendicular to the major surface 60a is taken as a Z axis. One axis perpendicular to the Z axis is taken as an X-axis direction. A direction perpendicular to the Z axis and the X axis is taken as a Y axis. The functional layer 10 is stacked with the stacked body 50 along the Z axis. In the specification of the application, "stacking" includes not only the case of being overlaid in contact with each other but also the case of being overlaid with another layer inserted therebetween. Being "provided on" includes not only the case of being provided in direct contact but also the case of being provided with another layer inserted therebetween.

In this example, the nitride semiconductor element 110 further includes a substrate 40. The foundation layer 60 is disposed between the substrate 40 and the stacked body 50 (e.g., the first stacked intermediate layer 50a). The substrate 40 has a major surface 40a. The major surface 40a of the substrate 40 is parallel to the major surface 60a of the foundation layer 60.

The substrate 40 may include, for example, a silicon substrate. For example, the substrate 40 is a Si (111) substrate. However, in the embodiment, the plane orientation of the substrate 40 may not be the (111) plane and may be, for example, the (100) plane or the (11n) plane orientation (n being an integer). For example, it is favorable to use a substrate 40 of the (110) plane to reduce the lattice mismatch between the silicon substrate and the nitride semiconductor layer.

A substrate including an oxide layer may be used as the substrate 40. For example, an SOI (silicon on insulator) substrate may be used as the substrate 40.

The substrate 40 includes a material that has a lattice constant different from the lattice spacing of the functional layer 10 or a material that has a coefficient of thermal expansion different from the coefficient of thermal expansion of the functional layer 10.

For example, sapphire, spinel, GaAs, InP, ZnO, Ge, SiGe, or SiC may be used as the material of the substrate 40.

There are cases where the nitride semiconductor element 110 is used in the state in which the substrate 40 is removed. There are cases where the nitride semiconductor element 110 is used in the state in which the foundation layer 60 and the stacked body 50 are removed. There are cases where the nitride semiconductor element 110 is used in the state in which a portion of the functional layer 10 is removed.

One axis parallel to the major surface 60a is taken as a first axis. The direction of the first axis may be any direction in the X-Y plane. For example, the a-axis of the crystal may be used as the first axis.

In the case where an axis (the Z axis) that is perpendicular to the major surface 60a of the foundation layer 60 is substantially parallel to the c-axis of the crystal of the foundation layer 60, the a-axis of the foundation layer 60 is substantially perpendicular to the Z axis. The a-axis may be any direction in the X-Y plane.

In such a case, the a-axis of the crystal included in the stacked body 50 is perpendicular to the Z axis. The a-axis of the crystal included in the functional layer 10 is perpendicular to the Z axis. The a-axis of the foundation layer 60, the a-axis of the stacked body 50, and the a-axis of the functional layer 10 are substantially parallel to each other.

Hereinbelow, the case will be described where the c-axis of the crystal is substantially parallel to the stacking direction (the Z axis). In other words, the a-axis is substantially perpendicular to the Z axis and parallel to the X-Y plane. However, as described below, the first axis of the embodiments may be an axis other than the a-axis.

The foundation layer 60 includes an AlN buffer layer 62 and an AlGaN foundation layer 63.

The AlN buffer layer 62 is disposed between the AlGaN foundation layer 63 and the substrate 40. The AlN buffer layer 62 is formed on the substrate 40 to contact the substrate 40.

Chemical reactions between AlN and silicon do not occur easily. Meltback etching and the like that occur due to reactions between silicon and gallium are suppressed by providing the AlN buffer layer 62 that includes AlN in contact with the substrate 40. For example, it is favorable for the thickness of the AlN buffer layer 62 to be not less than 20 nm (nanometers) and not more than 400 nm, e.g., about 100 nm.

The AlGaN foundation layer 63 is formed on the AlN buffer layer 62. The AlGaN foundation layer 63 includes Al, Ga, and N. For example, it is favorable for the Al composition ratio of the AlGaN foundation layer 63 to be not less than 0.1 and not more than 0.9. It is more favorable to be not less than 0.2 and not more than 0.6, e.g., 0.25. The Al composition ratio is the proportion of the number of the Al element atoms to the number of the group III element atoms. The AlGaN foundation layer 63 is not limited to being one layer; and multiple layers having different Al composition ratios may be stacked. In such a case, it is favorable for the Al composition ratio to gradually decrease in the direction from the AlN buffer layer 62 toward the functional layer 10. The defects that occur due to lattice mismatch are suppressed by stacking multiple layers having different Al composition ratios.

The suppression effect of the meltback etching can be increased by the AlGaN foundation layer 63. Also, a compressive stress is formed inside the AlGaN foundation layer 63; and the tensile stress that occurs due to the difference of the coefficient of thermal expansion between the substrate 40 and the nitride semiconductor (e.g., the functional layer 10) in the cooling process after the crystal growth is reduced. Thereby, the occurrence of cracks can be suppressed. For example, it is favorable for the thickness of the AlGaN foundation layer 63 to be not less than 100 nm and not more than 500 nm, e.g., about 250 nm.

In the case where multiple nitride semiconductor layers having mutually different compositions are stacked, the nitride semiconductor layer (e.g., the AlGaN foundation layer 63) that is stacked on top is formed to match the lattice spacing (the length of the lattice) of the nitride semiconductor layer (e.g., the AlN buffer layer 62) that is formed underneath.

Therefore, the actual lattice spacing of the nitride semiconductor layer is different from the unstrained lattice spacing (the lattice constant).

In the specification, "lattice constant" refers to the unstrained lattice spacing of the nitride semiconductor. "Lattice spacing" refers to the length of the actual lattice of the nitride semiconductor layer that is formed. For example, the lattice constant is a physical property constant. For example, the lattice spacing is the length of the actual lattice of the nitride semiconductor layer included in the nitride semiconductor element that is formed. For example, the lattice spacing is ascertained from X-ray diffraction measurements.

In this example, the foundation layer 60 further includes a GaN foundation layer 61. The AlGaN foundation layer 63 is disposed between the GaN foundation layer 61 and the AlN buffer layer 62. In other words, the GaN foundation layer 61 is formed on the AlGaN foundation layer 63. Compressive stress occurs easily in the crystal growth of the stacked body 50 by providing the GaN foundation layer 61 on the AlGaN foundation layer 63. Thereby, the occurrence of cracks can be suppressed.

When forming the GaN foundation layer 61 that has a lattice constant that is greater than the lattice spacing of the AlGaN foundation layer 63, the GaN foundation layer 61 is formed to have lattice matching with the lattice spacing of the AlGaN foundation layer 63; and compressive stress is formed in the GaN foundation layer 61. As the film thickness of the GaN foundation layer 61 increases, lattice relaxation occurs in the GaN foundation layer 61; and the lattice spacing of the GaN foundation layer 61 approaches the lattice spacing of unstrained GaN. In the case where the actual lattice spacing of the GaN foundation layer 61 is substantially the same as the lattice spacing of unstrained GaN (the lattice constant of GaN), the compressive stress that would be applied to the GaN foundation layer 61 does not occur even as the film thickness is increased; and the tensile stress from the substrate 40 has a greater effect. By appropriately setting the thickness of the GaN foundation layer 61, the state can be maintained in which the lattice spacing along the first axis (e.g., the a-axis) of the GaN is smaller than the lattice spacing along the first axis (e.g., the a-axis) of unstrained GaN (the lattice constant of GaN). For example, it is favorable for the thickness of the GaN foundation layer 61 to be not less than 100 nm and not more than 1000 nm, e.g., about 400 nm. The GaN foundation layer 61 may be provided if necessary and may be omitted in some cases.

The stacked body 50 is formed on the foundation layer 60. The stacked body 50 includes a GaN intermediate layer 51 (a first GaN intermediate layer 51a), a high Al composition layer 52 (a first high Al composition layer 52a), and a low Al composition layer 53 (a first low Al composition layer 53a). The GaN intermediate layer 51 is provided between the low Al composition layer 53 and the foundation layer 60. The high Al composition layer 52 is provided between the low Al composition layer 53 and the foundation layer 60. In other words, the low Al composition layer 53 is provided on the high Al composition layer 52; and the high Al composition layer 52 is provided on the GaN intermediate layer 51.

The high Al composition layer 52 (the first high Al composition layer 52a) includes $Al_{x1}Ga_{1-x1}N$ ($0<x1 \leq 1$). The high Al composition layer 52 (the first high Al composition layer 52a) may include, for example, AlN. The low Al composition layer 53 (the first low Al composition layer 53a) includes $Al_{y1}Ga_{1-y1}N$ ($0<y1<1$ and $y1<x1$).

For example, it is favorable for the thickness of the GaN intermediate layer 51 to be not less than 100 nm and not more than 1000 nm, e.g., about 300 nm.

For example, it is favorable for the Al composition ratio of the high Al composition layer 52 to be not less than 0.5 and not more than 1.0, e.g., about 1.0. In the case where the Al composition ratio of the high Al composition layer 52 is smaller than 0.5, it is difficult for the high Al composition layer 52 to be sufficiently relaxed. For example, it is favorable for the thickness of the high Al composition layer 52 to be not less than 5 nm and not more than 100 nm, e.g., about 12 nm. In the case where the thickness of the high Al composition layer 52 is thinner than 5 nm, it is difficult for the high Al composition layer 52 to be sufficiently relaxed. In the case where the thickness of the high Al composition layer 52 is thicker than 100 nm, the crystal quality of the high Al composition layer 52 degrades easily. For example, the surface flatness worsens; and pits occur easily. It is more favorable for the thickness of the high Al composition layer 52 to be not less than 10 nm and not more than 30 nm. The degradation of the crystal quality is suppressed further in the case where the thickness of the high Al composition layer 52 is not more than 30 nm.

The low Al composition layer 53 includes Al, Ga, and N. For example, it is favorable for the Al composition ratio of the low Al composition layer 53 to be not less than 0.1 and not more than 0.9, e.g., about 0.5. For example, it is favorable for the thickness of the low Al composition layer 53 to be not less than 5 nm and not more than 100 nm, e.g., about 25 nm. The Al composition ratio and the thickness of the low Al composition layer 53 are described below.

The functional layer 10 is formed on the stacked body 50.

In the case where the nitride semiconductor element 110 is a light emitting element, for example, the functional layer 10 includes an n-type semiconductor layer 11 formed on the stacked body 50, a light emitting layer 13 formed on the n-type semiconductor layer 11, and a p-type semiconductor layer 12 formed on the light emitting layer 13. The light emitting layer 13 includes multiple barrier layers of GaN, and InGaN (e.g., $In_{0.15}Ga_{0.85}N$) layers provided between the barrier layers. The light emitting layer 13 has a MQW (Multiple Quantum Well) structure or a SQW (Single-Quantum Well) structure. For example, it is favorable for the thickness of the functional layer 10 to be not less than 1 micrometer (µm) and not more than 5 µm, e.g., about 3.5 µm. Thus, the functional layer 10 may include an n-type semiconductor layer.

The nitride semiconductor element 110 may include, for example, a nitride semiconductor element of a gallium nitride (GaN) HEMT (High Electron Mobility Transistor). In such a case, for example, the functional layer 10 has a stacked structure of an undoped $Al_{z1}Ga_{1-z1}N$ ($0 \leq z1 \leq 1$) layer not including an impurity, and an undoped or n-type $Al_{z2}Ga_{1-z2}N$ ($0 \leq z2 \leq 1$ and $z1<z2$) layer.

A GaN layer 11i (an undoped GaN layer) may be provided on the stacked body 50 (e.g., between the stacked body 50 and the functional layer 10). Compressive strain (stress) is formed in the GaN layer 11i and the cracks are suppressed further by providing the GaN layer 11i (the undoped GaN layer). The GaN layer 11i may be a doped semiconductor layer such as an n-type semiconductor layer.

In FIG. 1B, FIG. 1C, and FIG. 1D, the vertical axis is the Z-axis direction position.

The horizontal axis of FIG. 1B is the Al composition ratio $C_{Al}$. As illustrated in FIG. 1B, the Al composition ratio $C_{Al}$ of the stacked body 50 is substantially 0 in the GaN intermediate layer 51, is substantially 1 in the high Al composition layer 52, and is higher than 0 and lower than 1 in the low Al composition layer 53.

The horizontal axis of FIG. 1C is the growth temperature GT. As illustrated in FIG. 1C, for example, the growth temperature GT of the GaN intermediate layer 51 is high. By the GaN intermediate layer 51 being high, the lattice relaxation can be suppressed; and the compressive stress formed in the GaN intermediate layer 51 can be increased. For example, it is favorable for the growth temperature GT to be not less than 1000° C. and not more than 1200° C., e.g., about 1130° C.

The growth temperature GT of the high Al composition layer 52 is low. For example, it is favorable for the growth temperature GT of the high Al composition layer 52 to be not less than 500° C. and not more than 1050° C., e.g., about 800° C. It is more favorable to be not less than 600° C. and not more than 850° C. In the case where the growth temperature GT of the high Al composition layer 52 is lower than 500° C., impurities are introduced easily. Also, cubic crystal AlGaN and the like grow; and crystal dislocations undesirably occur excessively. The crystal quality of the high Al composition layer 52 undesirably degrades excessively. In the case where the growth temperature GT of the high Al composition layer 52 is higher than 1050° C., the lattice relaxation does not occur easily. Therefore, the strain is not relaxed; and tensile strain is easily introduced to the high Al composition layer 52. Further, the compressive stress is not applied appropriately when forming the low Al composition layer 53 and/or the functional layer 10 on the high Al composition layer 52; and cracks occur easily in the cooling process after the crystal growth. Conversely, the lattice relaxation of the high Al composition layer 52 occurs easily in the case where the growth temperature GT of the high Al composition layer 52 is, for example, 800° C. As a result, the spacing of the high Al composition layer 52 approaches the value of the lattice spacing of unstrained state. In other words, the tensile strain from the GaN intermediate layer 51 and/or foundation layer 61 is not easily applied in the initial formation of the high Al composition layer 52. Thus, the high Al composition layer 52 having lattice relaxation is formed on the GaN intermediate layer 51.

The growth temperature GT of the low Al composition layer 53 is high. For example, it is favorable for the growth temperature GT of the low Al composition layer 53 to be not less than 800° C. and not more than 1200° C., e.g., 1130° C.

The horizontal axis of FIG. 1D is the lattice spacing Ld along the a-axis. FIG. 1D illustrates lattice spacing dg along the a-axis of unstrained GaN (e.g., 0.3189 nm) and lattice spacing da along the a-axis of unstrained AlN (e.g., 0.3112 nm). The lattice spacing da along the a-axis (the first axis) of the $Al_{x1}Ga_{1-x1}N$ $(0<x1\leq1)$ when unstrained corresponds to the lattice constant along the a-axis (the first axis) of the $Al_{x1}Ga_{1-x1}N$ $(0<x1\leq1)$. For example, in the case where the high Al composition layer 52 is AlN, the lattice spacing da along the a-axis (the first axis) of the unstrained high Al composition layer 52 corresponds to the lattice constant along the a-axis (the first axis) of AlN. The lattice spacing dg of unstrained GaN is larger than the lattice spacing da of unstrained AlN.

As illustrated in FIG. 1D, the lattice spacing along the a-axis (the first axis) of the GaN intermediate layer 51 is large; and the lattice spacing along the a-axis (the first axis) of the high Al composition layer 52 is small. For example, the actual lattice spacing along the a-axis (the first axis) of the GaN intermediate layer 51 is smaller than the lattice spacing dg along the a-axis (the first axis) of unstrained GaN; and the actual lattice spacing along the a-axis (the first axis) of the high Al composition layer 52 is, for example, larger than the lattice spacing da along the a-axis (the first axis) of the $Al_{x1}Ga_{1-x1}N$ $(0<x1\leq1)$ when unstrained. In the case where the high Al composition layer 52 is AlN, for example, the actual lattice spacing of the high Al composition layer 52 is larger than the lattice spacing da along the a-axis (the first axis) of unstrained AlN. In other words, in the stacked body 50, the lattice spacing along the a-axis (the first axis) is largest at the GaN intermediate layer 51 and decreases abruptly at the high Al composition layer 52. The lattice spacing along the a-axis (the first axis) of the low Al composition layer 53 is the same as or larger than the lattice spacing along the a-axis (the first axis) of the high Al composition layer 52.

When the actual lattice spacing along the a-axis (the first axis) of the GaN intermediate layer 51 is smaller than the lattice spacing dg along the a-axis (the first axis) of unstrained GaN, a compressive strain is applied to the first intermediate GaN layer 51.

When the third lattice spacing of the first high Al composition layer 52 is larger than the second lattice spacing (the $Al_{x1}Ga_{1-x1}N$ $(0<x1\leq1)$ when unstrained), a tensile strain is applied to the first high Al composition layer 52.

It is favorable for the lattice spacing along the a-axis (the first axis) of the GaN intermediate layer 51 to be small because the compressive stress that is applied to the GaN intermediate layer 51 increases as the lattice spacing along the a-axis (the first axis) of the GaN intermediate layer 51 decreases. Additionally, the lattice spacing of the high Al composition layer 52 that is formed on the GaN intermediate layer 51 decreases. The lattice spacing along the a-axis (the first axis) of the GaN intermediate layer 51 changes due to, for example, the ammonia partial pressure when forming the GaN intermediate layer 51. For example, the lattice spacing along the a-axis (the first axis) of the GaN intermediate layer 51 decreases as the ammonia partial pressure increases. For example, it is favorable for the ammonia partial pressure to be not less than 0.2 and not more than 0.5. The lattice spacing along the a-axis (the first axis) of the GaN intermediate layer 51 changes due to, for example, the ratio (the V/III ratio) of the source-material gas of the group V atoms and the source-material gas of the group III atoms when forming the GaN intermediate layer 51. For example, the lattice spacing along the a-axis (the first axis) of the GaN intermediate layer 51 decreases as the V/III ratio increases. For example, it is favorable for the ammonia partial pressure to be not less than 2000 and not more than 8000.

Here, a relaxation rate α (a lattice relaxation rate) is introduced as a parameter corresponding to the level of the relaxation of the strain (the relaxation of the lattice) of the crystal.

The lattice relaxation of the high Al composition layer 52 occurs when the high Al composition layer 52 is grown on the GaN intermediate layer 51. The relaxation rate α of the $Al_{x1}Ga_{1-x1}N$ $(0<x1\leq1)$ which is the high Al composition layer 52 is the ratio of the absolute value of the difference between the lattice spacing dg along the first axis (e.g., the a-axis) of unstrained GaN and an actual lattice spacing Da along the first axis (e.g., the a-axis) of the high Al composition layer 52 (the first high Al composition layer 52a) to the absolute value of the difference between the lattice spacing dg along the first axis (e.g., the a-axis) of unstrained GaN and the lattice spacing da along the first axis (e.g., the a-axis) of the $Al_{x1}Ga_{1-x1}N$ $(0<x1\leq1)$ when unstrained. In other words, the relaxation rate α of the high Al composition layer 52 is $|dg-Da|/|dg-da|$. The lattice spacing dg along the first axis (e.g., the a-axis) of unstrained GaN corresponds to the lattice constant of GaN. The lattice spacing da along the first axis (e.g., the a-axis) of the $Al_{x1}Ga_{1-x1}N$ $(0<x1\leq1)$ when unstrained corresponds to the lattice constant along the first axis (e.g., the a-axis) of the $Al_{x1}Ga_{1-x1}N$ $(0<x1\leq1)$.

For example, the lattice spacing (the lattice constant) along the first axis of $Al_xGa_{1-x}N$ when unstrained is a value calculated using Vegard's law from the lattice spacing (the lattice constant) along the first axis of unstrained AlN and the lattice spacing (the lattice constant) along the first axis of unstrained GaN.

The relaxation rate α of the high Al composition layer 52 changes due to the growth temperature GT when the high Al composition layer 52 is grown. Further, the relaxation rate α changes due to the growth rate, the ratio (the V/III ratio) of the source-material gas of the group V atoms to the source-material gas of the group III atoms, the ammonia partial pressure, etc. The V/III ratio is the ratio of the number of the atoms of the group V element supplied per unit time to the number of the atoms of the group III element supplied per unit time. The ammonia partial pressure is the ratio of the pressure of the ammonia to the pressure of the entire gas used in the film formation.

FIG. 2A to FIG. 2D are graphs illustrating characteristics of the nitride semiconductor element.

These drawings illustrate an example of the change of the relaxation rate α as the growth temperature GT, a growth rate GR, the V/III ratio (V/III), and an ammonia partial pressure Pp are changed in the formation when the AlN is grown in the case where the high Al composition layer 52 is AlN.

FIG. 2A illustrates the change of the relaxation rate α as the growth temperature GT is changed in the case where the V/III ratio is 11300, the growth rate GR is 3.9 nm/minute (min), and the ammonia partial pressure Pp is 0.06. As illustrated in FIG. 2A, for example, the relaxation rate α of the high Al composition layer 52 is 0.43 in the case where the growth temperature GT is 1100° C. when the AlN which is the high Al composition layer 52 is grown. In the case where the growth temperature GT is 650° C., the relaxation rate α is 0.71. Thus, the relaxation rate α increases when the growth temperature GT is low. To increase the relaxation rate α, it is favorable for the growth temperature GT of the formation to be lower than the growth temperature GT of the GaN intermediate layer 51.

Figure 2B:
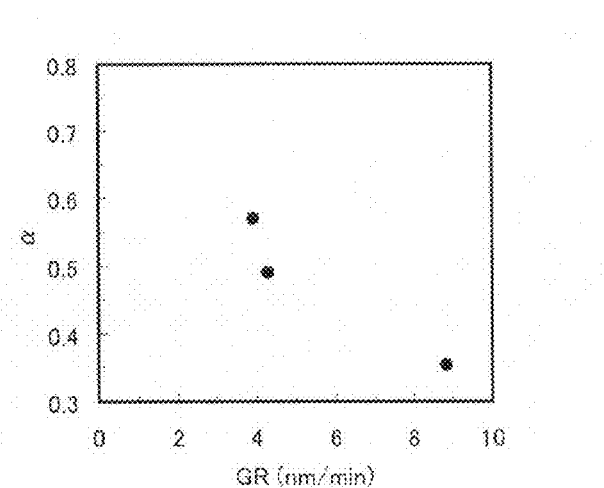

FIG. 2B illustrates the change of the relaxation rate α as the growth rate GR is changed in the case where the V/III ratio is 11300, the growth temperature GT is 800° C., and the ammonia partial pressure Pp is 0.06. As illustrated in FIG. 2B, for example, the relaxation rate α is 0.35 in the case where the growth rate GR of the AlN which is the high Al composition layer 52 is 8.82 nm/minute. The relaxation rate α is 0.57 in the case where the growth rate GR is 3.9 nm/minute. Thus, the relaxation rate α increases as the growth rate GR decreases. To increase the relaxation rate α, it is favorable for the growth rate of the formation to be less than the growth rate of the GaN intermediate layer 51. For example, it is favorable to be not less than 2 nm/minute and not more than 10 nm/minute. It is more favorable to be not less than 3 nm/minute and not more than 8 nm/minute.

Figure 2C:
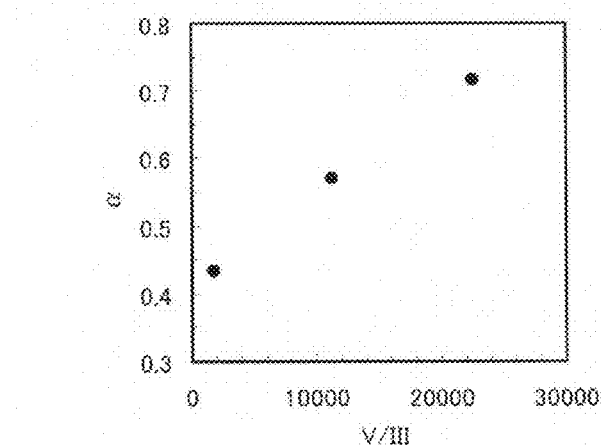

FIG. 2C illustrates the change of the relaxation rate α as the V/III ratio is changed in the case where the growth temperature GT is 800° C., the growth rate GR is 3.9 nm/minute, and the ammonia partial pressure Pp is 0.06. As illustrated in FIG. 2C, for example, the relaxation rate α is 0.44 in the case where the V/III ratio is 1800 when the AlN which is the high Al composition layer 52 is grown. In the case where the V/III ratio is 22600, the relaxation rate α is 0.72. Thus, the relaxation rate α increases when the V/III ratio is large. To increase the relaxation rate α, for example, it is favorable for the V/III ratio to be not less than 1500 and not more than 100000. It is more favorable to be not less than 10000 and not more than 50000. It is difficult for the high Al composition layer 52 to be sufficiently relaxed when the V/III ratio becomes smaller than 1500. When the V/III ratio becomes larger than 100000, the vapor phase reaction between the ammonia which is the source-material gas of the group V atoms and the aluminum which is the source-material gas of the group III atoms becomes excessive; and the crystal quality of the high Al composition layer 52 decreases.

Figure 2D:
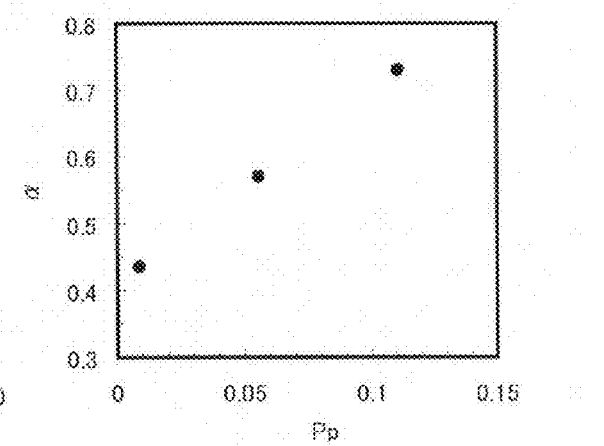

FIG. 2D illustrates the change of the relaxation rate α as the ammonia partial pressure Pp is changed in the case where the growth temperature GT is 800° C., the growth rate GR is 3.9 nm/minute, and the V/III ratio is 11300. As illustrated in FIG. 2D, for example, the relaxation rate α is 0.43 in the case where the ammonia partial pressure Pp is 0.009 when growing the AlN which is the high Al composition layer 52. In the case where the ammonia partial pressure Pp is 0.111, the relaxation rate α is 0.72. Thus, the relaxation rate α increases when the ammonia partial pressure Pp is large. To increase the relaxation rate α, it is favorable for the ammonia partial pressure Pp to be, for example, not less than 0.01 and not more than 0.5. It is more favorable to be not less than 0.04 and not more than 0.3. It is difficult for the high Al composition layer 52 to be sufficiently relaxed when the ammonia partial pressure Pp becomes smaller than 0.01. The vapor phase reaction between the ammonia which is the source-material gas of the group V atoms and the aluminum which is the source-material gas of the group III atoms becomes excessive when the ammonia partial pressure Pp becomes larger than 0.5; and the crystal quality of the high Al composition layer 52 decreases.

An increase of the relaxation rate α corresponds to a decrease of the actual lattice spacing Da along the a-axis (the first axis) of the high Al composition layer 52.

In the case where the lattice relaxation occurs completely in the high Al composition layer 52 and the actual lattice spacing Da along the a-axis (the first axis) of the high Al composition layer 52 is equal to the lattice spacing da along the a-axis (the first axis) of the $Al_{x1}Ga_{1-x1}N$ ($0<x1\leq1$) when unstrained, the crystal information of the GaN intermediate layer 51 cannot be acquired; fluctuation of the crystal axis occurs; and the crystal quality drastically degrades. Also, misfit dislocations increase due to the lattice relaxation; and the crystal quality degrades. Accordingly, it is favorable for the actual lattice spacing Da along the a-axis (the first axis) of the high Al composition layer 52 to be larger than the lattice spacing da along the a-axis (the first axis) of the $Al_{x1}Ga_{1-x1}N$ ($0<x1\leq1$) when unstrained. That is, it is preferable that the high Al composition layer 52 has a tensile stress. In other words, it is preferable that a tensile stress is applied to the high Al composition layer 52.

Continuing, the low Al composition layer 53 is formed on the high Al composition layer 52.

In the embodiment, the Al composition ratio of the low Al composition layer 53 is not more than the relaxation rate α of the high Al composition layer 52. In such a case, the lattice constant along the first axis (e.g., the a-axis) of the low Al composition layer 53 is larger than the actual lattice spacing of the high Al composition layer 52. The low Al composition layer 53 grows while being subjected to the compressive strain to have lattice matching with the lattice of the high Al composition layer 52. Therefore, an actual lattice spacing Dag along the first axis (e.g., the a-axis) of the low Al composition layer 53 is equal to or larger than the actual lattice spacing Da along the first axis (e.g., the a-axis) of the high Al composition layer 52.

Conversely, in the case where the Al composition ratio of the low Al composition layer 53 is larger than the relaxation rate α of the high Al composition layer 52, the lattice constant along the first axis (e.g., the a-axis) of the low Al composition layer 53 is smaller than the lattice spacing of the high Al composition layer 52. Therefore, the low Al composition layer 53 grows while being subjected to the tensile strain; and the lattice spacing along the first axis (e.g., the a-axis) of the low Al composition layer 53 is smaller than the actual lattice spacing Da along the first axis (e.g., the a-axis) of the high Al composition layer 52. Therefore, the tensile strain occurs; and the cracks occur easily.

In other words, in the case where the low Al composition layer 53 having an inappropriate Al composition ratio is formed on the high Al composition layer 52, the compressive strain is not formed; and the cracks cannot be suppressed. By forming the low Al composition layer 53 having an appropriate Al composition ratio that reflects the relaxation rate α of the high Al composition layer 52, the appropriate compressive strain is formed; and the cracks can be suppressed. In other words, good characteristics are obtained by forming the low Al composition layer 53 with an Al composition ratio that is not more than the relaxation rate α of the high Al composition layer 52.

For example, it is favorable for the thickness of the low Al composition layer 53 to be not less than 5 nm and not more than 100 nm. In the case where the thickness of the low Al composition layer 53 is thinner than 5 nm, it is difficult to obtain the suppression effect of the cracks and the reduction effect of the dislocations. In the case where the thickness of the low Al composition layer 53 is thicker than 100 nm, not only does the effect of reducing the dislocations saturate, but also the cracks occur more easily. It is more favorable for the thickness of the low Al composition layer 53 to be less than 50 nm. By the thickness of the low Al composition layer 53 being less than 50 nm, the cracks and the dislocation density can be reduced effectively.

For example, in the case where the high Al composition layer 52 is AlN and the low Al composition layer 53 is $Al_xGa_{1-x}N$, the $Al_xGa_{1-x}N$ layer is formed to have lattice matching with the actual lattice spacing of the AlN layer and grows while being subjected to the strain in the state (i.e., the initial growth) in which the $Al_xGa_{1-x}N$ layer is thin when growing the $Al_xGa_{1-x}N$ layer on the AlN layer. Then, as the growth of the $Al_xGa_{1-x}N$ progresses, the strain is gradually relaxed; and the lattice spacing of the $Al_xGa_{1-x}N$ that is grown approaches the lattice spacing of the $Al_xGa_{1-x}N$ in the state in which the strain is not applied. The $Al_xGa_{1-x}N$ grows while being subjected to compressive strain and the compressive strain is stored in the substrate 40 surface by forming the $Al_xGa_{1-x}N$ layer on an AlN layer such that the $Al_xGa_{1-x}N$ layer has lattice spacing that is smaller than the lattice constant of the $Al_xGa_{1-x}N$, where the lattice constant of the $Al_xGa_{1-x}N$ is larger than the actual lattice spacing of the AlN layer. As a result, warp having an upward-protruding configuration (a convex configuration) occurs in the substrate 40. By pre-storing the compressive strain during the crystal growth, the occurrence of the cracks that occur due to the coefficient of thermal expansion difference when cooling after the crystal growth can be suppressed. In addition to suppressing the cracks, the dislocations can be reduced by setting the Al composition ratio of the low Al composition layer 53 to a value that reflects the relaxation rate α of the high Al composition layer 52 and by setting the film thickness to an appropriate value (the values recited above).

The low Al composition layer 53 may include multiple layers. In such a case as well, the cracks can be suppressed by the Al composition ratio of the low Al composition layer 53 being not more than the relaxation rate α of the high Al composition layer 52. For example, the Al composition ratio of the low Al composition layer 53 may change in a step configuration that decreases in stages along the growth direction from the substrate 40 side or a gradually decreasing configuration along the growth direction. By such a configuration, the lattice relaxation of the low Al composition layer 53 can be suppressed; and the compressive stress formed in the low Al composition layer 53 can be increased. Also, the dislocations that reach the functional layer 10 can be reduced because bending occurs for the dislocations that occur at the substrate interface between the low Al composition layer 53 and the layer formed on the low Al composition layer 53.

As illustrated in FIG. 1C, the growth temperature GT of the low Al composition layer 53 is, for example, about 1130° C. In the case where the growth temperature GT of the low Al composition layer 53 is higher than the growth temperature GT of the high Al composition layer 52 by not less than 80° C., the effect of growing the low Al composition layer 53 to have lattice matching with the actual lattice spacing of the high Al composition layer 52 can be greater. For example, when the growth temperature GT of the low Al composition layer 53 is not less than 880° C., the thickness at which the growth has lattice matching increases. As a result, the compressive strain occurs easily; and the cracks are suppressed easily. Also, the reduction effect of the dislocations is greater. It is favorable for the growth temperature GT of the low Al composition layer 53 to be not less than the growth temperature GT of the GaN intermediate layer 51. Thereby, the flatness of the low Al composition layer 53 improves; and the crystallinity of the nitride semiconductor layer (e.g., the functional layer 10) that is formed on the low Al composition layer 53 improves.

For example, it is favorable for the total thickness of the high Al composition layer 52, the low Al composition layer 53, and the GaN intermediate layer 51 to be not less than 50 nm and not more than 2000 nm. In the case where the total thickness is less than 50 nm, the compressive stress is hard to be generated and the number of the stacking to suppress the crack increases. In the case where the number of stacks of these layers is large, the number of the heating processes and cooling processes for the growth temperature GT to obtain the desired thickness of the stacked body 50 increases excessively. Thereby, the crystal quality decreases by the excessive change of the temperature. Further, the productivity decreases. On the other hand, in the case where the total thickness is thicker than 2000 nm, the lattice relaxation easily occurs. As a result, the storage of the compressive strain is insufficient; and the cracks occur easily. It is more favorable for the total thickness to be not less than 300 nm and less than 1000 nm. By the total thickness being not less than 300 nm and less than 1000 nm, a flat surface is obtained easily; and it is easy to realize the effect of reducing the cracks and the dislocations.

Figure 11A:
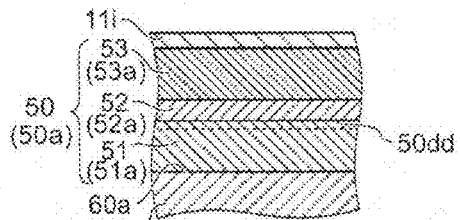
FIG. 11A to FIG. 11J are schematic views showing the configuration of nitride semiconductor wafers according to the embodiments.
Figure 11B:
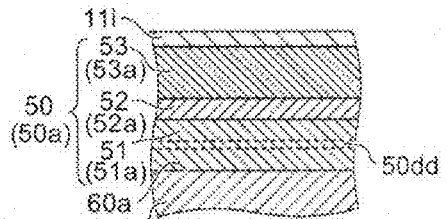
Figure 11C:
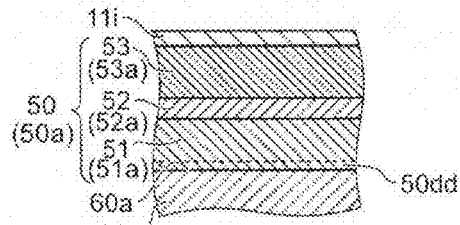

As shown in FIGS. 11A-11C, a δ-doped layer 50*dd* of Si may be provided at a portion of the GaN intermediate layer 51. In an example shown in FIG. 11A, the δ-doped layer 50*dd* is provided on the surface of the GaN intermediate layer 51 on the high Al composition layer 52 side. In an example shown in FIG. 11B, the δ-doped layer 50*dd* is provided in the interior of the GaN intermediate layer 51. In an example shown in FIG. 11C, the δ-doped layer 50*dd* is provided on the surface of the GaN intermediate layer 51 on the foundation layer 60 side.

Figure 11D:
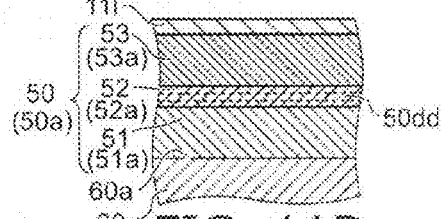

As shown in FIG. 11D, the δ-doped layer 50*dd* of Si may be provided at a portion of the high Al composition layer 52. In this case, the δ-doped layer 50*dd* may be provided on the surface of the high Al composition layer 52 on the low Al composition layer 53 side. The δ-doped layer 50*dd* may be provided in the interior of the high Al composition layer 52. The δ-doped layer 50*dd* may be provided on the surface of the high Al composition layer 52 on the GaN intermediate layer 51 side.

Figure 11E:
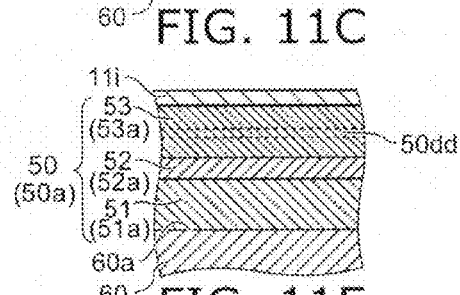
Figure 11F:
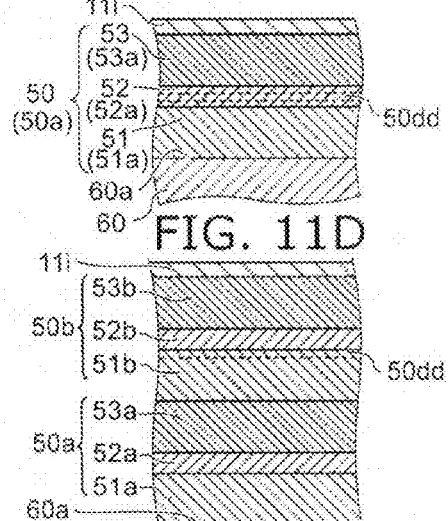
Figure 11G:
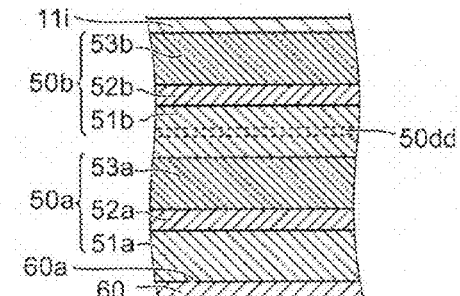
Figure 11H:
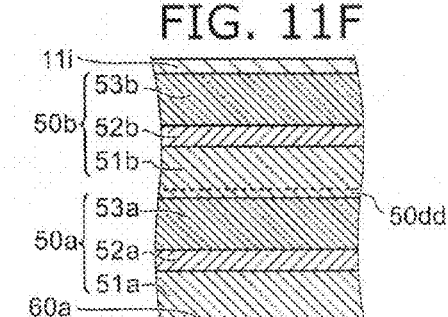
Figure 11I:
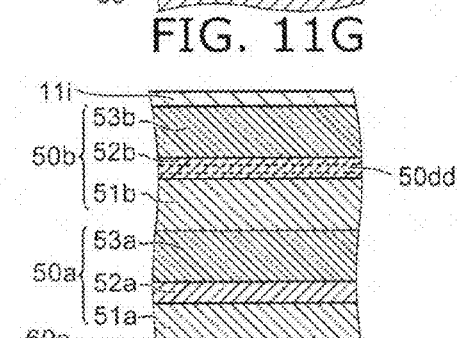
Figure 11J:
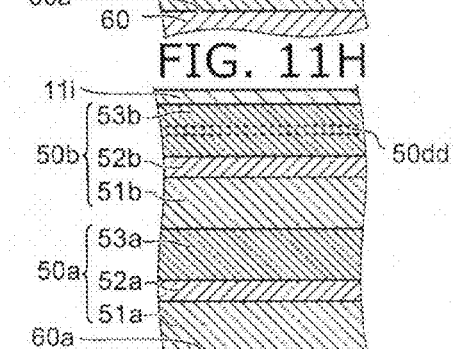

As shown in FIG. 11E, the δ-doped layer 50*dd* of Si may be provided at a portion of the low Al composition layer 53. In this case, the δ-doped layer 50dd may be provided on the surface of the low Al composition layer 53 on the GaN layer 111 side. The δ-doped layer 50dd may be provided in the interior of the low Al composition layer 53. The δ-doped layer 50dd may be provided on the surface of the low Al composition layer 53 on the high Al composition layer 52 side.

The δ-doped layer 50dd may include, for example, a layer that contains Si with a concentration of not less than $5 \times 10^{17}$ cm$^{-3}$ and not more than $2 \times 10^{19}$ cm$^{-3}$. By providing the δ-doped layer 50dd with such Si concentration, the compressive stress of the GaN layer (for example, the GaN layer 11i) formed on the δ-doped layer 50dd is increased and the crack can be suppressed more effectively.

Alternately, the δ-doped layer 50dd may include, for example, a layer that contains Si with a concentration of not less than $7 \times 10^{19}$ cm$^{-3}$ and not more than $5 \times 10^{20}$ cm$^{-3}$. By providing these δ-doped layers 50dd, shielding of the dislocations or bending of the dislocations occur at the δ-doped layer 50dd; and the dislocations that would reach the semiconductor layer (e.g., the functional layer 10) that is formed on the δ-doped layer 50dd can be reduced more effectively.

The concentration of Si in the δ-doped layer 50dd can be measured by a secondary ion secondary mass spectrometry (SIMS). In the SIMS measurement of the Si concentration of the δ-doped layer 50dd with thin thickness, there is case in which the measured result of the Si concentration shows a spreading profile in the thickness direction. In such a case, the Si concentration can be obtained from a value of Si sheet density. The Si sheet density is a value obtained by an integration of Si concentration in the depth direction (in the thickness direction). For example, the sheet density can be calculated to be a value of a total sum of Si atoms obtained by the integration in the area of the thickness of 200 nm in the thickness direction with a center for the Si concentration peak. For example, the Si concentration measured by SIMS of about $2 \times 10^{20}$ cm$^{-3}$ corresponds to the sheet density of about $1 \times 10^{15}$ cm$^{-2}$. Therefore, the Si concentration of the δ-doped layer 50dd not less than $5 \times 10^{17}$ cm$^{-3}$ and not more than $2 \times 10^{19}$ cm$^{-3}$ corresponds the sheet density not less than $2.5 \times 10^{12}$ cm$^{-2}$ and not more than $1 \times 10^{14}$ cm$^{-2}$. The Si concentration of the δ-doped layer 50dd not less than $7 \times 10^{19}$ cm$^{-3}$ and not more than $5 \times 10^{20}$ cm$^{-3}$ corresponds the sheet density not less than $3.5 \times 10^{14}$ cm$^{-2}$ and not more than $2.5 \times 10^{15}$ cm$^{-2}$.

For example, the thickness of the δ-doped layer 50dd is not less than 0.3 nm and not more than 200 nm. However, the concentration and the thickness are not limited thereto. The δ-doped layer 50dd may include a SiN layer in which a part of Si is bonded to nitrogen. The δ-doped layer 50dd may be formed in non-continuous configuration as well as in continuous configuration.

In the nitride semiconductor element 110 according to the embodiment, the stacked body 50 is provided between the functional layer 10 and the foundation layer 60. The stacked body 50 has a structure in which the GaN intermediate layer 51, the high Al composition layer 52, and the low Al composition layer 53 are stacked in this order. The composition ratio of the Al of the low Al composition layer 53 is not more than the relaxation rate α of the high Al composition layer 52, where the relaxation rate α of the high Al composition layer is the ratio of the difference between the lattice spacing dg along the first axis (e.g., the a-axis) of unstrained GaN and the actual lattice spacing Da along the first axis (e.g., the a-axis) of the high Al composition layer 52 to the absolute value of the difference between the lattice spacing dg along the first axis (e.g., the a-axis) of unstrained GaN and the lattice spacing da along the first axis (e.g., the a-axis) of the Al$_{x1}$Ga$_{1-x1}$N ($0 < x1 \leq 1$) when unstrained. Thereby, the compressive stress is applied in the crystal growth; and the effect of suppressing the occurrence of the cracks is obtained. Also, the effect of reducing the dislocations is obtained. Therefore, the cracks, the dislocations, etc., of the functional layer 10 are reduced. According to the nitride semiconductor element 110, a high-quality nitride semiconductor element that is formed on the substrate 40 (e.g., the silicon substrate) and has few cracks is obtained.

FIG. 3A to FIG. 3D are schematic views illustrating the configuration of another nitride semiconductor element according to the first embodiment.

FIG. 3A is a schematic cross-sectional view illustrating the configuration of the nitride semiconductor element 120 according to the embodiment. FIG. 3B to FIG. 3D are graphs illustrating the Al composition ratio ($C_{Al}$), the growth temperature GT, and the lattice spacing Ld along the a-axis, respectively, of the stacked intermediate layer.

As illustrated in FIG. 3A, the nitride semiconductor element 120 includes the foundation layer 60, the stacked body 50, and the functional layer 10. The configurations of the foundation layer 60 and the functional layer 10 are similar to those described in regard to the nitride semiconductor element 110, and a description is therefore omitted. In such a case as well, the GaN layer 11i (the undoped GaN layer) may be provided between the stacked body 50 and the functional layer 10.

The configuration of the stacked body 50 of the nitride semiconductor element 120 is different from that of the nitride semiconductor element 110. The stacked body 50 will now be described.

In the nitride semiconductor element 120, the stacked body 50 includes the first stacked intermediate layer 50a and a second stacked intermediate layer 50b. The first stacked intermediate layer 50a is provided between the foundation layer and the functional layer 10. The second stacked intermediate layer 50b is provided between the first stacked intermediate layer 50a and the functional layer 10.

The first stacked intermediate layer 50a includes the first GaN intermediate layer 51a provided on the foundation layer 60, the first high Al composition layer 52a provided on the first GaN intermediate layer 51a, and the first low Al composition layer 53a provided on the first high Al composition layer 52a.

The second stacked intermediate layer 50b includes a second GaN intermediate layer 51b provided on the first stacked intermediate layer 50a, a second high Al composition layer 52b provided on the second GaN intermediate layer 51b, and a second low Al composition layer 53b provided on the second high Al composition layer 52b.

The configurations of the first and second GaN intermediate layers 51a and 51b are similar to the configuration of the GaN intermediate layer 51 described in regard to the nitride semiconductor element 110. The configurations of the first and second high Al composition layers 52a and 52b are similar to the configuration of the high Al composition layer 52 described in regard to the nitride semiconductor element 110. The configurations of the first and second low Al composition layers 53a and 53b are similar to the configuration of the low Al composition layer 53 described in regard to the nitride semiconductor element 110.

The first high Al composition layer 52a may include Al$_{x1}$Ga$_{1-x1}$N ($0 < x1 \leq 1$).

The first low Al composition layer 53a may include Al$_{y1}$Ga$_{1-y1}$N ($0 < y1 < 1$ and $y1 < x1$).

The second high Al composition layer 52b may include Al$_{x2}$Ga$_{1-x2}$N ($0 < x2 \leq 1$).

The second low Al composition layer 53b may include $Al_{y2}Ga_{1-y2}N$ (0<y2<1 and y2<x2).

The Al composition ratio of the first low Al composition layer 53a is not more than the relaxation rate of the first high Al composition layer 52a (a first relaxation rate αa, i.e., the ratio of the absolute value of the difference between the lattice spacing dg along the first axis (e.g., the a-axis) of unstrained GaN and an actual lattice spacing Da1 along the first axis (e.g., the a-axis) of the first high Al composition layer 52a to the absolute value of the difference between the lattice spacing dg along the first axis (e.g., the a-axis) of unstrained GaN and the lattice spacing da along the first axis (e.g., the a-axis) of the $Al_{x1}Ga_{1-x1}N$ (0<x1≤1) when unstrained).

The Al composition ratio of the second low Al composition layer 53b is not more than the relaxation rate of the second high Al composition layer 52b (a second relaxation rate αb, i.e., the ratio of the absolute value of the difference between the lattice spacing dg along the first axis (e.g., the a-axis) of unstrained GaN and an actual lattice spacing Dat along the first axis (e.g., the a-axis) of the second high Al composition layer 52b to the absolute value of the difference between the lattice spacing dg along the first axis (e.g., the a-axis) of unstrained GaN and lattice spacing da1 along the first axis (e.g., the a-axis) of the $Al_{x2}Ga_{1-x2}N$ (0<x2≤1) when unstrained.

Two sets (periods) of the set that includes the GaN intermediate layer, the high Al composition layer, and the low Al composition layer are provided in the nitride semiconductor element 120. The embodiment is not limited thereto; and the number of the sets (the periods) may be three or more.

In the nitride semiconductor element 120 as well, a nitride semiconductor element that is formed on the substrate 40 (e.g., the silicon substrate) with few cracks and dislocations is obtained.

In the nitride semiconductor element 120, the configuration of the second stacked intermediate layer 50b may be different from that of the first stacked intermediate layer 50a. By repeating the forming the stacked intermediate layer 50 multiply, the relaxation of the strain becomes easily suppressed and the compressive strain is increased. On the functional layer 10s side of the stacked body, the thickness in which the layer can be formed with applying the compressive stress is increased. Therefore, for example, the thickness of the second stacked intermediate layer 50b may be thicker than the thickness of the first stacked intermediate layer 50a. For example, the thickness of the second GaN intermediate layer 51b may be thicker than the thickness of the first GaN intermediate layer 51a. The effect of further reducing the cracks and/or dislocations is obtained by changing the structure to correspond to the change of the amount of the strain that is stored in the stacking.

As illustrated in FIG. 3D, the lattice spacing along the a-axis of the first and second GaN intermediate layers 51a and 51b is large; and the lattice spacing along the a-axis of the first and second high Al composition layers 52a and 52b is small. For example, the actual lattice spacing along the a-axis of the first and second GaN intermediate layers 51a and 51b is smaller than the lattice spacing dg along the a-axis of unstrained GaN.

For example, the actual lattice spacing along the a-axis of the first high Al composition layer 52a is larger than the lattice spacing da1 along the a-axis of the $Al_{x1}Ga_{1-x1}N$ (0<x1≤1) when unstrained. For example, the actual lattice spacing along the a-axis of the second high Al composition layer 52b is larger than the lattice spacing da1 along the a-axis of the $Al_{x2}Ga_{1-x2}N$ (0<x2≤1) when unstrained. In other words, the lattice spacing along the a-axis of the first and second stacked intermediate layers 50a and 50b is greatest at the first and second GaN intermediate layers 51a and 51b and decreases abruptly at the first and second high Al composition layers 52a and 52b. The lattice spacing along the a-axis of the first and second low Al composition layers 53a and 53b is the same as or larger than the lattice spacing along the a-axis of the first and second high Al composition layers 52a and 52b.

The formation conditions, the characteristics, etc., of the first GaN intermediate layer 51a, the first high Al composition layer 52a, and the first low Al composition layer 53a of the first stacked intermediate layer 50a are similar to the formation conditions and the characteristics of the high Al composition layer 52, the low Al composition layer 53, and the GaN intermediate layer 51 of the stacked body 50 described in regard to the nitride semiconductor element 110.

The second GaN intermediate layer 51b of the second stacked intermediate layer 50b is formed on the first stacked intermediate layer 50a.

As illustrated in FIG. 3C, the growth temperature GT of the second GaN intermediate layer 51b is, for example, about 1130° C. For example, it is favorable for the thickness of the second GaN intermediate layer 51b to be not less than 100 nm and not more than 1000 nm, e.g., about 300 nm.

The second high Al composition layer 52b is formed on the second GaN intermediate layer 51b. For example, it is favorable for the thickness of the second high Al composition layer 52b to be not less than 5 nm and not more than 100 nm, e.g., about 12 nm. It is more favorable for the thickness of the second high Al composition layer 52b to be not less than 10 nm and not more than 30 nm. The degradation of the crystal quality is suppressed further in the case where the thickness of the second high Al composition layer 52b is not more than 30 nm. For example, it is favorable for the growth temperature GT of the second high Al composition layer 52b to be not less than 500° C. and not more than 1050° C., e.g., about 800° C. The lattice relaxation of the second high Al composition layer 52b occurs easily by forming at such a temperature.

Thereby, as illustrated in FIG. 3D, compared to the lattice spacing along the a-axis of the first GaN intermediate layer 51a and the lattice spacing along the a-axis of the second GaN intermediate layer 51b, the actual lattice spacing Ld along the a-axis of the second high Al composition layer 52b abruptly approaches the lattice spacing (the lattice constant) of the $Al_{x2}Ga_{1-x2}N$ (0<x2≤1) in the unstrained state. Therefore, from the initial formation stage of the second high Al composition layer 52b, the tensile strain from the first GaN intermediate layer 51a which is used to form the foundation is not easily applied. As a result, the second high Al composition layer 52b can be formed in the state of not being easily affected by the strain from the first GaN intermediate layer 51a used to form the foundation. Thus, the second high Al composition layer 52b that has abrupt lattice relaxation is formed on the first GaN intermediate layer 51a.

Continuing, the second low Al composition layer 53b that has a composition ratio of Al that is not more than the second relaxation rate αb of the second high Al composition layer 52b is formed on the second high Al composition layer 52b. For example, it is favorable for the thickness of the second low Al composition layer 53b to be not less than 5 nm and not more than 100 nm. It is more favorable for the thickness of the second low Al composition layer 53b to be less than 50 nm. The cracks and the dislocation density can be reduced effectively by the thickness of the second low Al composition layer 53b being less than 50 nm. The thickness of the second low Al composition layer 53b is, for example, about 25 nm.

For example, in the case where the second high Al composition layer 52b is AlN and the second low Al composition layer 53b is $Al_xGa_{1-x}N$, the $Al_xGa_{1-x}N$ is formed to have lattice matching with the actual lattice spacing of the AlN layer in the state in which the thickness is thin, that is, in the initial growth, and grows while being subjected to the strain. Then, the strain is gradually relaxed as the growth of the $Al_xGa_{1-x}N$ progresses; and the $Al_xGa_{1-x}N$ approaches the lattice spacing of the $Al_xGa_{1-x}N$ in the unstrained state.

As illustrated in FIG. 3B, for example, it is favorable for the Al composition ratio $C_{Al}$ of the second low Al composition layer 53b to be not less than 0.1 and not more than 0.9, e.g., about 0.5. For example, an $Al_{0.5}Ga_{0.5}N$ layer is used as the second low Al composition layer 53b.

As illustrated in FIG. 3C, for example, it is favorable for the growth temperature GT of the second low Al composition layer 53b to be not less than 800° C. and not more than 1200° C., e.g., about 1130° C. In the case where the growth temperature GT of the second low Al composition layer 53b is higher than the growth temperature GT of the second high Al composition layer 52b by not less than 80° C., the effect of growing the second high Al composition layer 52b to have lattice matching with the actual lattice spacing is greater. Also, the effect of reducing the dislocations is greater. For example, when the growth temperature GT of the second low Al composition layer 53b is not less than 880° C., the thickness at which the growth has lattice matching increases.

Thus, the stacked body 50 may have a structure in which the high Al composition layer 52, the low Al composition layer 53, and the GaN intermediate layer 51 are multiply stacked periodically in this order. Thereby, the compressive stress is applied in the crystal growth; and the effect of suppressing the occurrence of the cracks is greater. Also, the effect of reducing the dislocations is greater. Therefore, the cracks, the dislocations, etc., of the functional layer 10 are reduced further.

An example of the characteristics of the nitride semiconductor element of the embodiment will now be described.

The inventor of the application constructed the following samples.

The foundation layer 60 was formed on the substrate 40 (a silicon substrate). After forming the GaN intermediate layer 51 on the GaN foundation layer 61 (an undoped GaN layer) of the foundation layer 60 with a thickness of 300 nm at 1090° C., an AlN layer was formed with a thickness of 12 nm at 800° C. The AlN layer corresponds to the high Al composition layer 52.

Continuing, an $Al_zGa_{1-z}N$ layer was formed on the AlN layer with a thickness of 25 nm at 1130° C. This layer corresponds to the low Al composition layer 53. Here, the four types of the Al composition ratios z of the $Al_zGa_{1-z}N$ layers of 0.2, 0.35, 0.5, and 0.7 were used.

Then, three more periods of the stacked body recited above were formed, where one period is the stacked body of the GaN layer, the AlN layer, and the $Al_zGa_{1-z}N$ layer. That is, the number of periods of the stacked bodies of the intermediate layers was four for the four types of samples constructed by the inventor.

Continuing, the undoped GaN layer 11i was formed on the fourth $Al_zGa_{1-z}N$ layer with a thickness of 1 μm at 1090° C. Subsequently, an n-type GaN layer was formed with a thickness of 1 μm. Silicon was used as the n-type impurity; and the impurity concentration was $5 \times 10^{18}$ cm$^{-3}$. The n-type GaN layer was at least a portion of the functional layer 10.

FIG. 4 is a graph illustrating the characteristics of the nitride semiconductor elements.

FIG. 4 illustrates the characteristics relating to the curvature of the substrate when growing the samples that were constructed.

The horizontal axis of FIG. 4 is a thickness $t_{AlGaN}$ (nm) when growing the $Al_zGa_{1-z}N$ layer. The vertical axis illustrates a curvature Cv (km$^{-1}$=1000 m$^{-1}$) of the substrate 40 in the crystal growth. The curvature Cv is a value that substantially corresponds to the warp of the substrate 40. The curvature Cv of the substrate 40 is a value measured by optical monitoring system in the crystal growth. The curvature Cv indicates the transition of the warp of the substrate 40 during the crystal growth of the $Al_zGa_{1-z}N$ layer. For the curvature Cv in this drawing, the warp of the substrate 40 is 0 when starting the crystal growth. The curvature Cv having a positive value corresponds to the state of protruding upward (warp having a recessed configuration, i.e. concave configuration). A negative value corresponds to the state of protruding downward (warp having a protruding configuration, i.e. convex configuration). A positive curvature Cv corresponds to the warp of the substrate 40 due to the tensile stress applied to the nitride semiconductor crystal. A negative curvature Cv corresponds to the warp of the substrate 40 due to the compressive stress applied to the nitride semiconductor crystal. FIG. 4 illustrates the characteristics of the four types of samples having different Al composition ratios of the $Al_zGa_{1-z}N$ layer.

As illustrated in FIG. 4, the curvature Cv is positive in the case where the Al composition ratio z is 0.7. In other words, warp having a recessed configuration (convex configuration) occurs; and tensile stress is applied to the $Al_zGa_{1-z}N$ layer. The absolute value of the curvature Cv increases and the tensile stress increases as the thickness $t_{AlGaN}$ of the $Al_zGa_{1-z}N$ layer increases.

The curvature Cv is negative when the Al composition ratio z is 0.2, 0.35, or 0.5. In other words, warp having a protruding configuration occurs; and compressive stress is applied to the $Al_zGa_{1-z}N$ layer. The absolute value of the curvature Cv increases as the thickness $t_{AlGaN}$ of the $Al_zGa_{1-z}N$ layer increases.

Although a slight compressive stress is applied in the initial growth when the Al composition ratio z is 0.5, saturation eventually occurs; and the curvature Cv of the substrate 40 does not change and is constant even in the case where the thickness $t_{AlGaN}$ is increased. This means that the stress substantially is not formed in the $Al_zGa_{1-z}N$ layer. In the case where the Al composition ratio z is small, i.e., 0.35, the compressive stress is higher and the warp having the protruding configuration is greater than when the Al composition ratio z is 0.5. When the Al composition ratio z is 0.2, the compressive stress increases further and the warp having the protruding configuration increases further.

FIG. 5A to FIG. 5D are micrographs illustrating characteristics of the nitride semiconductor elements.

FIG. 5A to FIG. 5D are micrographs of the surface of the n-type GaN layer (the layer used to form at least a portion of the functional layer 10). FIG. 5A to FIG. 5D correspond to the four types of samples in which the Al composition ratios z of the $Al_zGa_{1-z}N$ layers are 0.2, 0.35, 0.5, and 0.7, respectively.

Figure 5A:
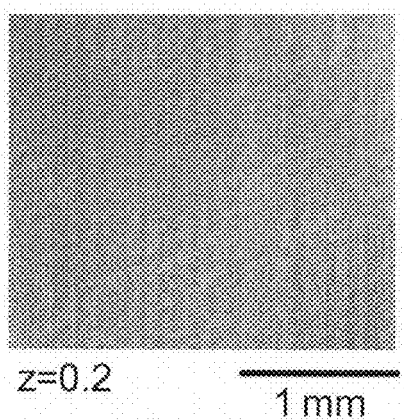
FIG. 5A to FIG. 5D are micrographs showing characteristics of the nitride semiconductor elements.
Figure 5B:
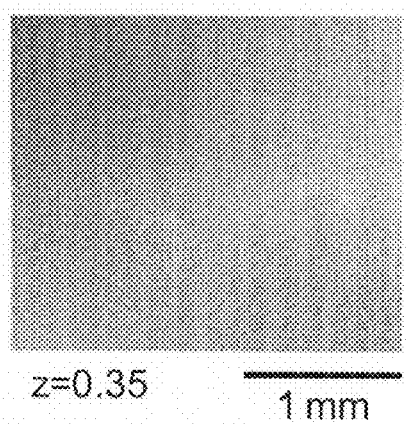
Figure 5C:
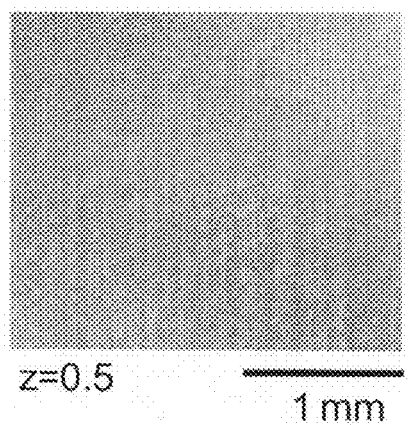
Figure 5D:
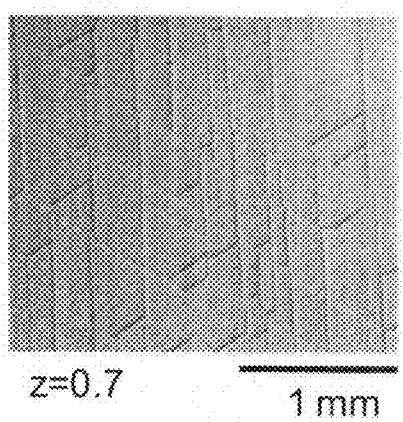

As illustrated in FIG. 5D, many cracks occurred in the n-type GaN layer for the sample in which the Al composition ratio z of the $Al_zGa_{1-z}N$ layer was 0.7 (the sample in which the tensile stress was formed).

As illustrated in FIG. 5A to FIG. 5C, cracks were not observed in the case where the Al composition ratio z was 0.2, 0.35, or 0.5. The cracks that occur in the n-type GaN layer were reduced by the compressive stress being formed. In other words, it was found that the occurrence of the cracks can be greatly suppressed by suppressing the tensile strain applied to the low Al composition layer 53 (the $Al_zGa_{1-z}N$ layer).

Thus, it was found that the stress applied to the low Al composition layer 53 has a relationship with the Al composition ratio of the low Al composition layer 53.

The actual lattice spacing along the a-axis at the formation temperature of the high Al composition layer 52 can be calculated from the results of the change of the curvature of the substrate 40 in the growth of the high Al composition layer 52 measured by optical monitoring. In this example, the high Al composition layer 52 was AlN; and the lattice spacing of the AlN was 0.3145 nm when converted to the actual lattice spacing at room temperature. On the other hand, the lattice spacing dg along the a-axis of unstrained GaN is, for example, 0.3189 nm; and the lattice spacing da along the a-axis of unstrained AlN is, for example, 0.3112 nm. Accordingly, in this case, the relaxation rate α of the AlN which is the high Al composition layer 52 corresponds to 0.57.

FIG. 6A to FIG. 6D are schematic views illustrating the results of X-ray diffraction measurements of the nitride semiconductor elements.

These drawings are examples of reciprocal lattice mapping images of the (11-24) plane measured by X-ray diffraction measurements. The horizontal axis is a reciprocal Qx of the lattice plane spacing of the (11-20) plane of a direction perpendicular to the growth direction. Qx is a value that is proportional to the reciprocal of the lattice spacing along the a-axis. The vertical axis is a reciprocal Qz of the lattice plane spacing of the (0004) plane of a direction parallel to the growth direction. Qz is a value that is proportional to the reciprocal of the lattice spacing along the c-axis. These drawings illustrate the point of a diffraction peak Pg of the (11-24) plane of the GaN (corresponding to the reciprocal of the lattice spacing of the GaN) and the point of a diffraction peak Pa of the (11-24) plane of the AlN (corresponding to the reciprocal of the lattice spacing of the AlN buffer layer 62). The dotted line connecting these points illustrates the characteristic of the reciprocal of the lattice spacing corresponding to the Al composition ratio of the AlGaN layer according to Vegard's law.

These drawings illustrate a point P63 of the diffraction peak of the (11-24) plane due to the AlGaN foundation layer 63 and a point P53 of the diffraction peak of the (11-24) plane due to the low Al composition layer 53.

In these drawings, the case where the peaks (the point P63 and the point P53) of the measurement results of the lattice spacing of the AlGaN layer appear on the lower side of the dotted line corresponds to the crystal having compressive strain (being subjected to compressive stress). The case where the peaks (the point P63 and the point P53) of the measurement results appear on the upper side of the dotted line corresponds to the crystal having tensile strain (being subjected to tensile stress).

FIG. 6A to FIG. 6D correspond to the four types of samples in which the Al composition ratios z of the Al$_z$Ga$_{1-z}$N layers are 0.2, 0.35, 0.5, and 0.7, respectively.

FIG. 6A to FIG. 6D show that the point P63 of the peak due to the AlGaN foundation layer 63 appears on the lower side of the dotted line for all of the samples. This shows that the AlGaN foundation layer 63 has compressive strain (is subjected to compressive stress).

The stacked body 50 is formed on such an AlGaN foundation layer 63. By forming the stacked body 50 on the AlGaN foundation layer 63, the compressive stress formed in the stacked body 50 increases; the tensile strain occurring in the cooling process after the crystal growth decreases; and the effect of suppressing the cracks is greater.

Figure 6A:
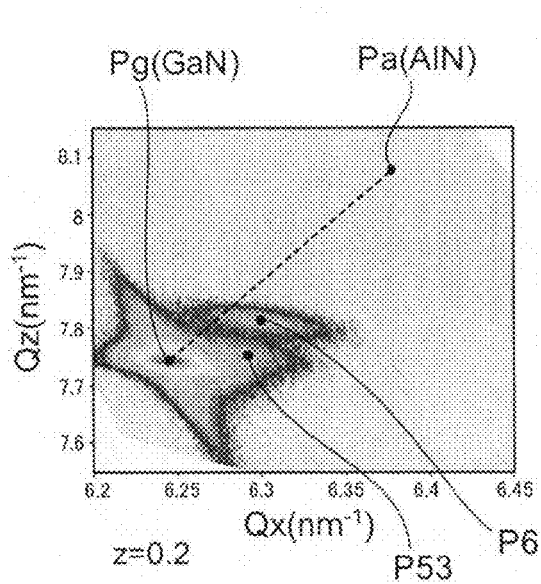
FIG. 6A to FIG. 6D are schematic views showing the results of X-ray diffraction measurements of the nitride semiconductor elements.
Figure 6B:
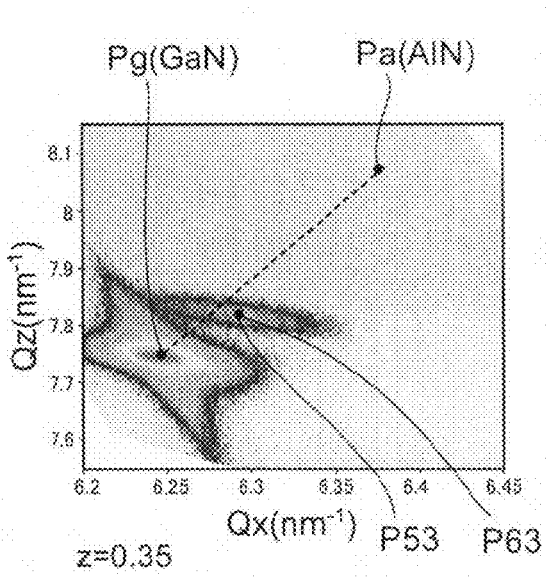
Figure 6C:
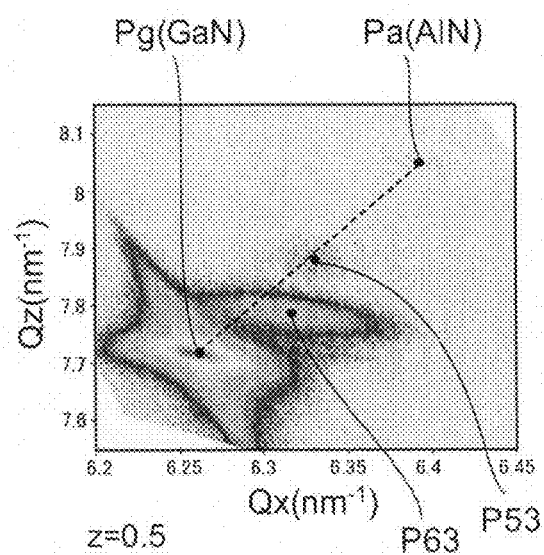
Figure 6D:
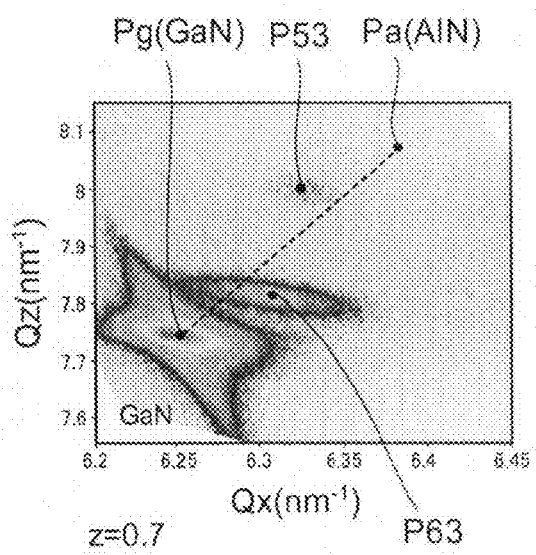

In the case where the Al composition ratio z of the low Al composition layer 53 is 0.7 as illustrated in FIG. 6D, it can be seen that the peak appears on the upper side of the dotted line; and the low Al composition layer 53 has tensile strain (is subjected to tensile stress).

On the other hand, in the case where the composition ratio z of the Al of the low Al composition layer 53 is 0.5 as illustrated in FIG. 6C, it can be seen that the peak appears slightly on the lower side of the dotted line; and the low Al composition layer 53 has compressive strain (is subjected to compressive stress).

In the case where the Al composition ratio z of the low Al composition layer 53 is 0.35 as illustrated in FIG. 6B, the peak of the low Al composition layer 53 overlays the peak of the AlGaN foundation layer 63; and a distinct peak is not observed for the low Al composition layer 53. In other words, the peak of the low Al composition layer 53 has moved downward from the state illustrated in FIG. 6C.

In the case where the Al composition ratio z of the low Al composition layer 53 is 0.2 as illustrated in FIG. 6A, the peak of the low Al composition layer 53 has moved downward from the state illustrated in FIG. 6B.

Thus, as the Al composition ratio z of the low Al composition layer 53 decreases, the peak position appears more on the side of being subjected to the compressive strain. These results are well-matched to the results of the stress change due to the curvature Cv in the growth illustrated in FIG. 4. Also, this is well-matched to the results of the crack density change illustrated in FIG. 5A to FIG. 5D.

In the case where the Al composition ratio z of the low Al composition layer 53 formed on the high Al composition layer 52 was 0.7, tensile strain was formed in the low Al composition layer 53. In the case where the Al composition ratio z of the low Al composition layer 53 formed on the high Al composition layer 52 was 0.5, compressive strain was formed in the low Al composition layer 53. From these results, it is considered that the lattice spacing along the a-axis of the high Al composition layer 52 is the lattice spacing along the a-axis of the AlGaN layer of the Al composition ratio in the range of not less than 0.5 and not more than 0.7. This value substantially matches the value (0.57) of the relaxation rate α of the high Al composition layer 52 that was calculated from the curvature change of the substrate 40 when growing the high Al composition layer 52.

In X-ray diffraction measurements of a nitride semiconductor element that was constructed without providing the low Al composition layer 53, the Qx value of the diffraction peak of the (11-24) plane of the high Al composition layer 52 was confirmed at a position corresponding to the AlGaN layer in which the Al composition ratio is 0.54. In other words, it was found that the relaxation rate α of the high Al composition layer 52 was about 0.54; and this substantially matches the results recited above.

In other words, it was found that the tensile stress occurs in the low Al composition layer 53 (the low Al composition layer 53 has tensile strain) in the case where the Al composition ratio of the low Al composition layer 53 is larger than the relaxation rate α of the high Al composition layer 52. It was found that the compressive stress occurs in the low Al composition layer 53 (the low Al composition layer 53 has compressive strain) in the case where the Al composition ratio of the low Al composition layer 53 is smaller than the relaxation rate α of the high Al composition layer 52.

The lattice spacing along the a-axis when unstrained (the lattice constant of the a-axis) of the Al$_z$Ga$_{1-z}$N layer in the case where the Al composition ratios z of the Al$_z$Ga$_{1-z}$N layers are 0.2, 0.35, 0.5, and 0.7 are 0.3174 nm, 0.3162 nm, 0.3151 nm, and 0.3135 nm, respectively. In the case of this example as described above, the actual lattice spacing along the a-axis of the AlN which is the high Al composition layer 52 is 0.3145 nm. Accordingly, the compressive strain is not formed and the cracks cannot be suppressed simply by forming the low Al composition layer 53 on the high Al composition layer 52 with an Al composition ratio that is smaller than that of the high Al composition layer 52. The compressive strain is formed and the cracks can be suppressed by forming the low Al composition layer 53 with an Al composition ratio that reflects the actual lattice spacing along the a-axis of the high Al composition layer 52, i.e., the relaxation rate α of the high Al composition layer 52. In other words, the compressive strain is formed and the cracks can be suppressed by forming the low Al composition layer 53 with an Al composition ratio that is not more than the relaxation rate α of the high Al composition layer 52.

The dislocation density will now be described.

Figure 7:
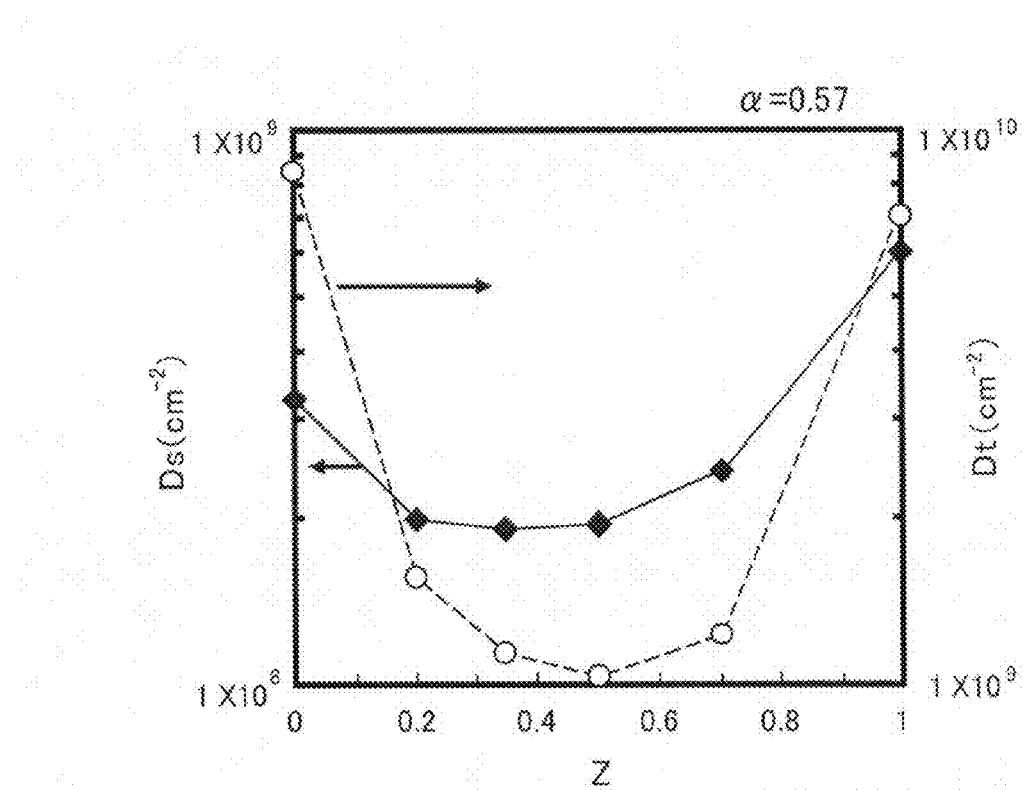
FIG. 7 is a graph showing the dislocation density of the nitride semiconductor.

FIG. 7 is a graph illustrating the dislocation density of the nitride semiconductor.

FIG. 7 illustrates the dislocation density for the four samples recited above in which the Al composition ratio z of the $Al_zGa_{1-z}N$ layer was changed and a sample in which the Al composition ratio z was 0. The horizontal axis of FIG. 7 is the Al composition ratio x. The vertical axis on the left is a screw dislocation density Ds ($cm^{-2}$). The vertical axis on the right is an edge dislocation density Dt ($cm^{-2}$).

As illustrated in FIG. 7, the screw dislocation density Ds and the edge dislocation density Dt are high when the Al composition ratio z is 0. The screw dislocation density Ds is low in the range in which the Al composition ratio z is 0.2 to 0.5. The screw dislocation density Ds increases when the Al composition ratio z is 0.7. On the other hand, the edge dislocation density Dt decreases as the Al composition ratio z increases in the range of 0 to 0.5. The edge dislocation density Dt increases when the Al composition ratio z is 0.7.

It is considered that the misfit dislocations that occur between the low Al composition layer 53 and the high Al composition layer 52 are suppressed as the Al composition ratio z increases in the range of 0 to 0.5 because the lattice constant of the low Al composition layer 53 approaches the actual lattice spacing of the high Al composition layer 52. It is considered that in the case where the Al composition ratio z exceeds 0.5, the lattice constant of the low Al composition layer 53 becomes smaller than the actual lattice spacing of the high Al composition layer 52; the misfit dislocations increase; and the dislocation density increases.

It was found that a low dislocation density (e.g., the lowest dislocation density) is obtained in the case where the Al composition ratio of the low Al composition layer 53 is about the same as the relaxation rate α of the high Al composition layer 52. The Al composition ratio at which the dislocation density is low depends on the relaxation rate α of the high Al composition layer 52. This is because the lattice constant of the low Al composition layer 53 at which the misfit dislocations occur changes dependent on the change of the actual lattice spacing of the high Al composition layer 52. When the relaxation rate α is small, the Al composition ratio at which the dislocation density is low decreases. In other words, there is a relative relationship between the Al composition ratio of the low Al composition layer 53 and the relaxation rate α of the high Al composition layer 52; and the Al composition ratio at which the dislocation density is low has an appropriate range.

FIG. 7 illustrates the results of the case where the relaxation rate α of the high Al composition layer 52 is 0.57. In such a case, the dislocation density abruptly increases when the Al composition ratio of the low Al composition layer 53 becomes 0.2 or less. In other words, the dislocation density abruptly increases when the Al composition ratio becomes 35% or more of the relaxation rate α (in this example, 0.57). On the other hand, the tensile strain is formed and the cracks increase when the Al composition ratio of the low Al composition layer 53 becomes larger than the relaxation rate α of the high Al composition layer 52.

Thus, a high-quality nitride semiconductor element having few cracks and dislocations can be provided by the Al composition ratio of the low Al composition layer 53 being not more than the relaxation rate α of the high Al composition layer 52 for the stacked body 50 having a structure in which the high Al composition layer 52, the low Al composition layer 53, and the GaN intermediate layer 51 are stacked in this order.

FIG. 8A to FIG. 8D are schematic views illustrating configurations of nitride semiconductor elements.

Figure 8A:
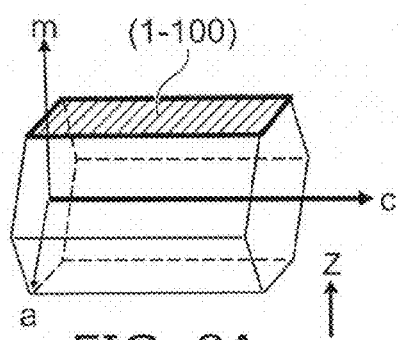
FIG. 8A to FIG. 8D are schematic views showing configurations of nitride semiconductor elements.
Figure 8B:
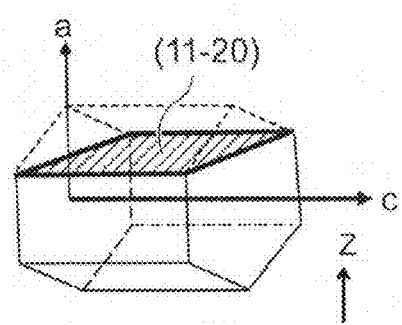

As illustrated in FIG. 8A and FIG. 8B, the c-axis of the nitride semiconductor layer of the nitride semiconductor element may be perpendicular to the Z-axis direction (a direction perpendicular to the major surface 60a of the foundation layer 60 and perpendicular to the major surface 40a of the substrate 40). In such a case, the first axis relating to the lattice spacing may be, for example, an axis parallel to the (1-100) plane. For example, the first axis may be an axis parallel to the (11-20) plane.

Figure 8C:
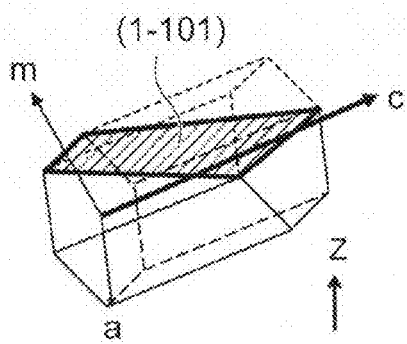
Figure 8D:
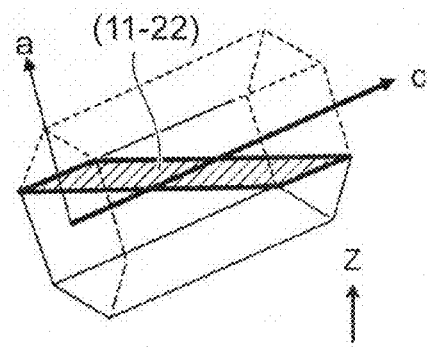

As illustrated in FIG. 8C and FIG. 8D, the c-axis of the nitride semiconductor layer may be tilted with respect to the Z-axis direction. In such a case, for example, the first axis relating to the lattice spacing may be an axis parallel to the (1-101) plane. For example, the first axis may be an axis parallel to the (11-22) plane.

These are examples; and any axis parallel to the major surface 60a of the foundation layer 60 (any axis parallel to the major surface 40a of the substrate 40) is applicable as the first axis of the embodiment.

Second Embodiment

The embodiment relates to a nitride semiconductor wafer. For example, at least a portion of the semiconductor device or a portion that is used to form at least a portion of the semiconductor device is provided in this wafer. For example, the semiconductor device includes a semiconductor light emitting element, a semiconductor light receiving element, an electronic device, etc.

FIG. 9A to FIG. 9D are schematic views illustrating the configuration of the nitride semiconductor wafer according to the second embodiment.

FIG. 9A is a schematic cross-sectional view illustrating the configuration of the nitride semiconductor wafer 210 according to the embodiment. FIG. 9B is a graph illustrating the Al composition ratio ($C_{Al}$) of the stacked intermediate layer. FIG. 9C is a graph illustrating the growth temperature GT (the formation temperature) of the stacked intermediate layer. FIG. 9D is a graph illustrating the lattice spacing Ld along the a-axis of the stacked intermediate layer.

As illustrated in FIG. 9A, the nitride semiconductor wafer 210 according to the embodiment includes the substrate 40, the foundation layer 60, and the stacked body 50. The stacked body 50 includes the first stacked intermediate layer 50a; and the nitride semiconductor wafer 210 may further include the functional layer 10. The configurations described in regard to the first embodiment are applicable to the substrate 40, the foundation layer 60, the stacked body 50, and the functional layer 10. The foundation layer 60 is provided on the major surface 40a of the substrate 40; the stacked body 50 is provided on the foundation layer 60; and the functional layer 10 is provided on the stacked body 50. The Al composition ratio of the low Al composition layer 53 is not more than the relaxation rate α of the high Al composition layer 52.

According to the nitride semiconductor wafer 210, a nitride semiconductor wafer for a high-quality nitride semiconductor element having few cracks and dislocations can be provided.

In the embodiment as well, the GaN layer 11i (the undoped GaN layer) may be provided on the stacked body 50 (e.g., between the stacked body 50 and the functional layer 10).

FIG. 10A to FIG. 10D are schematic views illustrating the configuration of another nitride semiconductor wafer according to the second embodiment.

FIG. 10A is a schematic cross-sectional view illustrating the configuration of the nitride semiconductor wafer 220 according to the embodiment. FIG. 10B to FIG. 10D are graphs illustrating the Al composition ratio ($C_{Al}$), the growth temperature GT, and the lattice spacing Ld along the a-axis of the stacked intermediate layer, respectively.

In the nitride semiconductor wafer 220 as illustrated in FIG. 10A, the stacked body 50 includes the first stacked intermediate layer 50a and the second stacked intermediate layer 50b. The first stacked intermediate layer 50a is provided on the foundation layer 60. For example, the first stacked intermediate layer 50a is provided between the foundation layer and the functional layer 10. The second stacked intermediate layer 50b is provided between the first stacked intermediate layer 50a and the functional layer 10.

The first stacked intermediate layer 50a includes the first GaN intermediate layer 51a provided on the foundation layer 60, the first high Al composition layer 52a provided on the first GaN intermediate layer 51a, and the first low Al composition layer 53a provided on the first high Al composition layer 52a. The second stacked intermediate layer 50b includes the second GaN intermediate layer 51b provided on the first stacked intermediate layer 50a, the second high Al composition layer 52b provided on the second GaN intermediate layer 51b, and the second low Al composition layer 53b provided on the second high Al composition layer 52b.

The Al composition ratio of the first low Al composition layer 53a is not more than the relaxation rate αa of the first high Al composition layer 52a. The Al composition ratio of the second low Al composition layer 53b is not more than the relaxation rate αb of the second high Al composition layer 52b.

According to the nitride semiconductor wafer 220, a nitride semiconductor wafer for a high-quality nitride semiconductor element having few cracks and dislocations can be provided.

In this example as well, the GaN layer 11i (the undoped GaN layer) may be provided between the stacked body 50 and the functional layer 10.

In the embodiment illustrated in FIG. 3A or FIG. 10A, the second GaN intermediate layer 51b, the second high Al composition layer 52b, and the second low Al composition layer 53b may be considered to be the first GaN intermediate layer 51a, the first high Al composition layer 52a, and the first low Al composition layer 53a, respectively.

As shown in FIGS. 11F-11J, the δ-doped layer 50dd of Si may be provided in at least one of the second GaN intermediate layer 51b, the second high Al composition layer 52b and the second low Al composition layer 53b. In addition, the δ-doped layer 50dd of Si may be provided in at least one of the second GaN intermediate layer 51b, the second high Al composition layer 52b and the second low Al composition layer 53b, while the δ-doped layer 50dd of Si is provided in at least one of the first GaN intermediate layer 51a, the first high Al composition layer 52a and the first low Al composition layer 53a.

The configuration of the position of the δ-doped layer 50dd in the second GaN intermediate layer 51b, the second high Al composition layer 52b and the second low Al composition layer 53b may be the same as the configuration for the case of the first GaN intermediate layer 51a, the first high Al composition layer 52a and the first low Al composition layer 53a, respectively.

In the embodiment, for example, metal-organic chemical vapor deposition (MOCVD), metal-organic vapor phase epitaxy (MOVPE), molecular beam epitaxy (MBE), hydride vapor phase epitaxy (HVPE), etc., may be used to grow the semiconductor layer.

For example, in the case where MOCVD or MOVPE is used, the following may be used as the source material when forming each of the semiconductor layers. For example, TMGa (trimethylgallium) and TEGa (triethylgallium) may be used as the source material of Ga. For example, TMIn (trimethylindium), TEIn (triethylindium), etc., may be used as the source material of In. For example, TMAl (trimethylaluminum), etc., may be used as the source material of Al. For example, $NH_3$ (ammonia), MMHy (monomethylhydrazine), DMHy (dimethylhydrazine), etc., may be used as the source material of N. $SiH_4$ (monosilane), $Si_2H_6$ (disilane), etc., may be used as the source material of Si.

According to the embodiments, a nitride semiconductor element and a nitride semiconductor wafer having few cracks can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in nitride semiconductor elements and nitride semiconductor wafers such as substrates, foundation layers, AlN buffer layers, AlGaN foundation layers, GaN foundation layers, stacked intermediate layers, high Al composition layers, low Al composition layers, GaN intermediate layers, functional layers, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all nitride semiconductor elements and nitride semiconductor wafers practicable by an appropriate design modification by one skilled in the art based on the nitride semiconductor element and nitride semiconductor wafer described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor element, comprising:
a foundation layer including an AlN buffer layer, the foundation layer having a major surface;
a functional layer including a nitride semiconductor; and
a stacked body provided between the major surface and the functional layer, the stacked body including a first stacked intermediate layer including:
a first GaN intermediate layer provided on the foundation layer;
a first high Al composition layer of $Al_{x1}Ga_{1-x1}N$ ($0<x1\leq1$) provided on the first GaN intermediate layer; and
a first low Al composition layer of $Al_{y1}Ga_{1-y1}N$ ($0<y1<1$ and $y1<x1$) provided on the first high Al composition layer of $Al_{x1}Ga_{1-x1}N$ ($0<x1\leq1$), a compressive strain being applied to the first low Al composition layer of $Al_{y1}Ga_{1-y1}N$ ($0<y1<1$ and $y1<x1$),
unstrained GaN having a first lattice spacing along a first axis parallel to the major surface,
unstrained $Al_{x1}Ga_{1-x1}N$ ($0<x1\leq1$) having a second lattice spacing along the first axis,
the first high Al composition layer of $Al_{x1}Ga_{1-x1}N$ ($0<x1\leq1$) having a third lattice spacing along the first axis, and
an Al composition ratio of the first low Al composition layer of $Al_{y1}Ga_{1-y1}N$ ($0<y1<1$ and $y1<x1$) being not more than a ratio of an absolute value of a difference between the first lattice spacing and the third lattice spacing to an absolute value of a difference between the first lattice spacing and the second lattice spacing.

2. The nitride semiconductor element according to claim 1, further comprising a GaN layer provided between the stacked body and the functional layer.

3. The nitride semiconductor element according to claim 1, wherein
the stacked body further includes a second stacked intermediate layer provided between the first stacked intermediate layer and the functional layer,
the second stacked intermediate layer includes
a second GaN intermediate layer provided on the first stacked intermediate layer,
a second high Al composition layer of $Al_{x2}Ga_{1-x2}N$ ($0<x2\leq1$) provided on the second GaN intermediate layer, and
a second low Al composition layer of $Al_{y2}Ga_{1-y2}N$ ($0<y2<1$ and $y2<x2$) provided on the second high Al composition layer of $Al_{x2}Ga_{1-x2}N$ ($0<x2\leq1$), a compressive strain being applied to the second low Al composition layer of $Al_{y2}Ga_{1-y2}N$ ($0<y2<1$ and $y2<x2$); and
unstrained $Al_{x2}Ga_{1-x2}N$ ($0<x2\leq1$) having a fourth lattice spacing along the first axis,
the second high Al composition layer of $Al_{x2}Ga_{1-x2}N$ ($0<x2\leq1$) having a fifth lattice spacing along the first axis, and
an Al composition ratio of the second low Al composition layer of $Al_{y2}Ga_{1-y2}N$ ($0<y2<1$ and $y2<x2$) being not more than a ratio of an absolute value of a difference between the first lattice spacing and the fifth lattice spacing to an absolute value of a difference between the first lattice spacing and the fourth lattice spacing.

4. The nitride semiconductor element according to claim 3, wherein a thickness of the second GaN intermediate layer is thicker than a thickness of the first GaN intermediate layer.

5. The nitride semiconductor element according to claim 1, wherein the Al composition ratio of the first low Al composition layer of $Al_{y1}Ga_{1-y1}N$ ($0<y1<1$ and $y1<x1$) is not less than 35% of the ratio of the absolute value of the difference between the first lattice spacing and the third lattice spacing to the absolute value of the difference between the first lattice spacing and the second lattice spacing.

6. The nitride semiconductor element according to claim 1, wherein
the third lattice spacing is larger than the second lattice spacing.

7. The nitride semiconductor element according to claim 1, wherein
a lattice spacing along the first axis of the first GaN intermediate layer is smaller than the first lattice spacing.

8. The nitride semiconductor element according to claim 1, further comprising a substrate,
the foundation layer being disposed between the substrate and the stacked body.

9. The nitride semiconductor element according to claim 1, wherein a sum of a thickness of the first high Al composition layer, a thickness of the first low Al composition layer, and a thickness of the first GaN intermediate layer is not less than 50 nm and not more than 2000 nm.

10. The nitride semiconductor element according to claim 1, wherein the first GaN intermediate layer includes a δ-doped layer provided on a surface of the GaN intermediate layer on a side of the first high Al composition layer of $Al_{x1}Ga_{1-x1}N$ ($0<x1\leq1$) and the δ-doped layer includes Si.

11. The nitride semiconductor element according to claim 10, wherein a Si concentration in the δ-doped layer is not less than $7\times10^{19}$ cm$^{-3}$ and not more than $5\times10^{20}$ cm$^{-3}$.

12. A nitride semiconductor wafer, comprising:
a substrate having a major surface;
a foundation layer provided on the major surface and including an AlN buffer layer; and
a stacked body provided on the foundation layer, the stacked body including a first stacked intermediate layer including:
a first GaN intermediate layer provided on the foundation layer;
a first high Al composition layer of $Al_{x1}Ga_{1-x1}N$ ($0<x1\leq1$) provided on the first GaN intermediate layer; and
a first low Al composition layer of $Al_{y1}Ga_{1-y1}N$ ($0<y1<1$ and $y1<x1$) provided on the first high Al composition layer of $Al_{x1}Ga_{1-x1}N$ ($0<x1\leq1$), a compressive strain being applied to the first low Al composition layer of $Al_{y1}Ga_{1-y1}N$ ($0<y1<1$ and $y1<x1$), unstrained GaN having a first lattice spacing along a first axis parallel to the major surface, unstrained $Al_{x1}Ga_{1-x1}N$ ($0<x1\leq1$) having a second lattice spacing along the first axis, the first high Al composition layer of $Al_{x1}Ga_{1-x1}N$ ($0<x1\leq1$) having a third lattice spacing along the first axis, and an Al composition ratio of the first low Al composition layer of $Al_{y1}Ga_{1-y1}N$ ($0<y1<1$ and $y1<x1$) being not more than a ratio of an absolute value of a difference between the first lattice spacing and the third lattice spacing to an absolute value of a difference between the first lattice spacing and the second lattice spacing.

13. The nitride semiconductor wafer according to claim 12, further comprising a functional layer including a nitride semiconductor provided on the first stacked intermediate layer.

14. The nitride semiconductor wafer according to claim 12, further comprising a GaN layer provided on the first stacked intermediate layer.

15. The nitride semiconductor wafer according to claim 14, further comprising a functional layer including a nitride semiconductor provided on the GaN layer provided on the first stacked intermediate layer.

16. The nitride semiconductor wafer according to claim 12, wherein the stacked body further includes a second stacked intermediate layer provided on the first stacked intermediate layer;

the second stacked intermediate layer includes a second GaN intermediate layer provided on the first stacked intermediate layer, a second high Al composition layer of $Al_{x2}Ga_{1-x2}N$ ($0<x2\leq1$) provided on the second GaN intermediate layer, and a second low Al composition layer of $Al_{y2}Ga_{1-y2}N$ ($0<y2<1$ and $y2<x2$) provided on the second high Al composition layer of $Al_{x2}Ga_{1-x2}N$ ($0<x2\leq1$), a compressive strain being applied to the second low Al composition layer of $Al_{y2}Ga_{1-y2}N$ ($0<y2<1$ and $y2<x2$); and unstrained $Al_{x2}Ga_{1-x2}N$ ($0<x2\leq1$) having a fourth lattice spacing along the first axis, the second high Al composition layer of $Al_{x2}Ga_{1-x2}N$ ($0<x2\leq1$) having a fifth lattice spacing along the first axis, and an Al composition ratio of the second low Al composition layer of $Al_{y2}Ga_{1-y2}N$ ($0<y2<1$ and $y2<x2$) being not more than a ratio of an absolute value of a difference between the first lattice spacing and the fifth lattice spacing to an absolute value of a difference between the first lattice spacing and the fourth lattice spacing.

17. The nitride semiconductor wafer according to claim 16, wherein a thickness of the second GaN intermediate layer is thicker than a thickness of the first GaN intermediate layer.

18. The nitride semiconductor wafer according to claim 12, wherein the Al composition ratio of the first low Al composition layer of $Al_{y1}Ga_{1-y1}N$ ($0<y1<1$ and $y1<x1$) is not less than 35% of the ratio of the absolute value of the difference between the first lattice spacing and the third lattice spacing to the absolute value of the difference between the first lattice spacing and the second lattice spacing.

19. The nitride semiconductor wafer according to claim 12, wherein the third lattice spacing is larger than the second lattice spacing.

20. The nitride semiconductor wafer according to claim 12, wherein a lattice spacing along the first axis of the first GaN intermediate layer is smaller than the first lattice spacing.

* * * * *